(12) United States Patent
Shi et al.

(10) Patent No.: US 12,389,767 B2
(45) Date of Patent: Aug. 12, 2025

(54) DISPLAY PANEL AND METHOD FOR MANUFACTURING A DISPLAY PANEL HAVING A TILED SCREEN WITH A FAN-OUT LEAD REGION

(71) Applicant: BOE TECHNOLOGY GROUP CO., LTD., Beijing (CN)

(72) Inventors: Lubin Shi, Beijing (CN); Wanpeng Teng, Beijing (CN); Liang Chen, Beijing (CN); Bin Qin, Beijing (CN); Ke Wang, Beijing (CN); Jintao Peng, Beijing (CN); Fangzhen Zhang, Beijing (CN); Kuanjun Peng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 527 days.

(21) Appl. No.: 17/783,207

(22) PCT Filed: May 20, 2021

(86) PCT No.: PCT/CN2021/094894
§ 371 (c)(1),
(2) Date: Jun. 7, 2022

(87) PCT Pub. No.: WO2021/233382
PCT Pub. Date: Nov. 25, 2021

(65) Prior Publication Data
US 2023/0013848 A1    Jan. 19, 2023

(30) Foreign Application Priority Data

May 20, 2020    (CN) ......................... 202010431623.X

(51) Int. Cl.
*H10K 59/131*    (2023.01)
*H10K 59/12*     (2023.01)
(Continued)

(52) U.S. Cl.
CPC ....... *H10K 59/131* (2023.02); *H10K 59/1213* (2023.02); *H10K 59/126* (2023.02); *H10K 59/18* (2023.02); *H10K 59/1201* (2023.02)

(58) Field of Classification Search
CPC ............. H10K 59/131; H10K 59/1213; H10K 59/126; H10K 59/18; H10K 59/1201;
(Continued)

(56) References Cited

U.S. PATENT DOCUMENTS

| 5,811,866 A | 9/1998 | Hirata | |
| 2007/0052895 A1* | 3/2007 | Chen ................... | H05K 1/0265 349/139 |

(Continued)

FOREIGN PATENT DOCUMENTS

| CN | 104464533 A | 3/2015 |
| CN | 106206670 A | 12/2016 |

(Continued)

OTHER PUBLICATIONS

Office Action for the Chinese Patent Application No. 202010431623.X issued by the Chinese Patent Office on Mar. 25, 2022.

*Primary Examiner* — Wael M Fahmy
*Assistant Examiner* — Tiberiu Dan Onuta
(74) *Attorney, Agent, or Firm* — XSENSUS LLP

(57) ABSTRACT

A display panel has a display region and a fan-out lead region, the fan-out lead region is located within the display region. The display panel comprises a base, a pixel circuit layer, a plurality of fan-out leads disposed between the base and the pixel circuit layer and located in the fan-out lead region, and an electrical field shielding pattern disposed between the pixel circuit layer and a film layer in which the plurality of fan-out leads are located. The pixel circuit layer includes a plurality of pixel circuits, at least one pixel circuit is located in the fan-out lead region. At least one fan-out lead (Continued)

is electrically connected to the pixel circuits. Orthographic projection of active layer patterns of transistors of the pixel circuit located in the fan-out lead region on the base are located within an orthographic projection of the electric field shielding pattern on the base.

19 Claims, 11 Drawing Sheets

(51) Int. Cl.
  *H10K 59/121* (2023.01)
  *H10K 59/126* (2023.01)
  *H10K 59/18* (2023.01)
(58) Field of Classification Search
  CPC ............... H10K 59/123; H10K 59/122; H10K 59/1315; H01L 25/0753; H01L 25/167; H01L 33/62
  See application file for complete search history.

(56) References Cited

U.S. PATENT DOCUMENTS

| 2016/0254338 | A1 | 9/2016 | Lin et al. |
| 2017/0069664 | A1* | 3/2017 | Nakamura ............... H01L 33/62 |
| 2018/0219057 | A1 | 8/2018 | Han |
| 2019/0131295 | A1 | 5/2019 | Xin et al. |
| 2021/0327964 | A1* | 10/2021 | Jeon ........................ H10K 59/38 |
| 2022/0068972 | A1* | 3/2022 | Gong ................... H01L 25/0753 |
| 2022/0310573 | A1* | 9/2022 | Liu ........................ H01L 25/167 |

FOREIGN PATENT DOCUMENTS

| CN | 206627737 U | 11/2017 |
| CN | 107664891 A | 2/2018 |
| CN | 109976056 A | 7/2019 |
| CN | 110034131 A | 7/2019 |
| CN | 110190103 A | 8/2019 |
| CN | 110875363 A | 3/2020 |
| CN | 111584587 A | 8/2020 |

* cited by examiner

DISPLAY PANEL AND METHOD FOR MANUFACTURING A DISPLAY PANEL HAVING A TILED SCREEN WITH A FAN-OUT LEAD REGION

CROSS-REFERENCE TO RELATED APPLICATIONS

This application is a national phase entry under 35 USC 371 of International Patent Application No. PCT/CN2021/094894, filed on May 20, 2021, which claims priority to Chinese Patent Application No. 202010431623.X, filed on May 20, 2020, which are incorporated herein by reference in their entirety.

TECHNICAL FIELD

The present disclosure relates to the field of display technologies, and in particular, to a display panel and a method for manufacturing the same, and a tiled screen.

BACKGROUND

Due to limitations of the current technological level of self-luminous devices, it is still difficult to fabricate large-sized and extra-large-sized display screens. Tiling a plurality of small screens together is the main way to realize the large-sized and extra-large-sized display screens.

SUMMARY

In an aspect, a display panel is provided. The display panel has a display region and a fan-out lead region, and the fan-out lead region is located in the display region. The display panel includes a base, a pixel circuit layer, a plurality of fan-out leads and an electric field shielding pattern. The pixel circuit layer is disposed on the base and located in the display region; the pixel circuit layer includes a plurality of pixel circuits, at least one pixel circuit is located in the fan-out lead region, a pixel circuit includes a plurality of transistors, and each transistor has an active layer pattern. The plurality of fan-out leads are disposed between the base and the pixel circuit layer and located in the fan-out lead region; at least one fan-out lead is electrically connected to the pixel circuits. The electric field shielding pattern is disposed between the pixel circuit layer and a film layer where the plurality of fan-out leads are located, at least orthographic projections of active layer patterns of transistors of the pixel circuit located in the fan-out lead region on the base are located within an orthographic projection of the electric field shielding pattern on the base; the electric field shielding pattern is configured to be applied with a constant voltage to shield interference signals, from the plurality of fan-out leads, acting on the active layer patterns of the transistors located in the fan-out lead region.

In some embodiments, a region of the display region other than the fan-out lead region is a main display region; orthographic projections of active layer patterns of transistors of pixel circuits located in the main display region on the base are located within the orthographic projection of the electric field shielding pattern on the base.

In some embodiments, the display panel further includes gate driving circuits electrically connected to the plurality of pixel circuits. The gate driving circuits are configured to provide gate driving signals to the plurality of pixel circuits, and a gate driving circuit includes another plurality of transistors. The gate driving circuits are disposed in the display region; or, the display panel further has a peripheral region disposed around the display region, and the gate driving circuits are disposed in the peripheral region. Orthographic projections of active layer patterns of transistors of the gate driving circuits on the base are located within the orthographic projection of the electric field shielding pattern on the base.

In some embodiments, the pixel circuit layer further includes first signal lines extending into the fan-out lead region and electrically connected to a pixel circuit located in the fan-out lead region. Orthographic projections of portions, extending to the fan-out lead region, of the first signal lines on the base are located within the orthographic projection of the electric field shielding pattern on the base.

In some embodiments, the pixel circuit includes a driving transistor. The electric field shielding pattern is electrically connected to a gate of the driving transistor through a first via in insulating layers between a film layer where the gate of the driving transistor is located and the electric field shielding pattern. Or, the electric field shielding pattern is electrically connected to a source or a drain of the driving transistor through a second via in insulating layers between a film layer where the source and the drain of the driving transistor are located and the electric field shielding pattern.

In some embodiments, the display panel further includes a plurality of elements to be driven disposed on a side of the pixel circuit layer away from the base. A first electrode of each element to be driven is electrically connected to a pixel circuit. The pixel circuit layer further includes a first power supply line electrically connected to pixel circuits and configured to transmit a first power supply voltage signal to the pixel circuits connected thereto, and a second power supply line electrically connected to second electrodes of elements to be driven and configured to transmit a second power supply voltage signal to the second electrodes of the elements to be driven connected thereto. The plurality of fan-out leads include a first power supply fan-out lead configured to be electrically connected to the first power supply line, and a second power supply fan-out lead configured to be electrically connected to the second power supply line. The electric field shielding pattern is electrically connected to the first power supply line through a third via in insulating layers between a film layer where the first power supply line is located and the electric field shielding pattern. Or, the electric field shielding pattern is electrically connected to the second power supply line through a fourth via in insulating layers between a film layer where the second power supply line is located and the electric field shielding pattern. Or, the electric field shielding pattern is electrically connected to the first power supply fan-out lead or the second power supply fan-out lead through a fifth via in an insulating layer between the film layer where the plurality of fan-out leads are located and the electric field shielding pattern.

In some embodiments, the first power supply fan-out lead is electrically connected to the first power supply line through a sixth via in insulating layers between the film layer where the first power supply line is located and the film layer where the plurality of fan-out leads are located; the second power supply fan-out lead is electrically connected to the second power supply line through a seventh via in insulating layers between the film layer where the second power supply line is located and the film layer where the plurality of fan-out leads are located. Or, in a case where the electric field shielding pattern is electrically connected to the first power supply line, the first power supply fan-out lead is electrically connected to the electric field shielding pattern through the fifth via in the insulating layer between the electric field shielding pattern and the film layer where the plurality of fan-out leads are located; in a case where the electric field shielding pattern is electrically connected to the second power supply line, the second power supply fan-out lead is electrically connected to the electric field shielding pattern through the fifth via in the insulating layer between the electric field shielding pattern and the film layer where the plurality of fan-out leads are located.

In some embodiments, the display panel further includes at least one ground line disposed between the pixel circuit layer and the film layer where the plurality of fan-out leads are located. The electric field shielding pattern is electrically connected to the ground line.

In some embodiments, the electric field shielding pattern has a continuous structure.

In some embodiments, the electric field shielding pattern includes a plurality of electric field shielding electrodes arranged separately, and each pixel circuit located in the fan-out lead region corresponds to an electric field shielding electrode. The electric field shielding electrode is electrically connected to a gate, a source or a drain of a driving transistor in the plurality of transistors of a corresponding pixel circuit; or the pixel circuit layer further includes first power supply lines, and the electric field shielding electrode is electrically connected to a first power supply line that is electrically connected to a corresponding pixel circuit; or the display panel further includes a plurality of elements to be driven, the pixel circuit layer further includes second power supply lines, and the electric field shielding electrode is electrically connected to a second power supply line that is electrically connected to an element to be driven by a corresponding pixel circuit.

In some embodiments, the electric field shielding pattern includes a plurality of electric field shielding electrodes arranged separately, and each transistor located in the fan-out lead region corresponds to an electric field shielding electrode. The electric field shielding electrode is electrically connected to a gate, a source or a drain of a corresponding transistor.

In some embodiments, the orthographic projection of the electric field shielding pattern on the base and at least part of a region, except for orthographic projections of active layer patterns of the plurality of pixel circuits on the base, of the display panel are staggered from each other.

In some embodiments, the pixel circuit layer includes a semiconductor layer, and the semiconductor layer includes active layer patterns of the plurality of pixel circuits. A shape of the electric field shielding pattern is substantially same as a shape of the semiconductor layer.

In some embodiments, the electric field shielding pattern is configured to be applied with the constant voltage of 0V.

In some embodiments, the display panel further includes: connection elements disposed on a side of the base away from the plurality of fan-out leads; and a plurality of side traces extending from the fan-out lead region to the side of the base away from the plurality of fan-out leads through a side surface of the base, each fan-out lead being electrically connected to a connection element through a side trace. Or, the display panel further includes connection elements disposed on a side of the base away from the plurality of fan-out leads; the base is provided with a plurality of eighth vias therein, and each fan-out lead is electrically connected to a connection element through an eighth via.

In some embodiments, the display panel further includes a driving circuit disposed on the side of the base away from the plurality of fan-out leads, and the driving circuit is electrically connected to the connection elements.

In another aspect, a tiled screen is provided. The tiled screen includes a plurality of display panels; the plurality of display panels are tiled together, and at least one display panel is the display panel as described in the above embodiments.

In yet another aspect, a method for manufacturing a display panel is provided. The display panel has a display region and a fan-out lead region, and the fan-out lead region is located in the display region. The method includes: forming a plurality of fan-out leads on a region, corresponding to the fan-out lead region, of a base; forming an electric field shielding pattern on a side of the plurality of fan-out leads away from the base; and forming a pixel circuit layer on a side of the electric field shielding pattern away from the base. The pixel circuit layer includes a plurality of pixel circuits; at least one pixel circuit is located in the fan-out lead region, a pixel circuit includes a plurality of transistors, and each transistor has an active layer pattern. At least orthographic projections of active layer patterns of transistors of the pixel circuit located in the fan-out lead region on the base are located within an orthographic projection of the electric field shielding pattern on the base. The electric field shielding pattern is configured to be applied with a constant voltage to shield interference signals, from the plurality of fan-out leads, acting on the active layer patterns of the transistors located in the fan-out lead region.

In some embodiments, the method further includes: before forming the plurality of fan-out leads on the base, forming a sacrificial layer on a substrate, and forming connection elements on the sacrificial layer forming the base of the display panel on a side of the connection elements away from the substrate; and after forming the plurality of fan-out leads on the base, performing a treatment on the sacrificial layer to separate the base and the substrate.

In some embodiments, forming the plurality of fan-out leads on the region, corresponding to the fan-out lead region, of the base, includes: forming the plurality of fan-out leads on the base and make the plurality of fan-out leads electrically connected to the connection elements.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
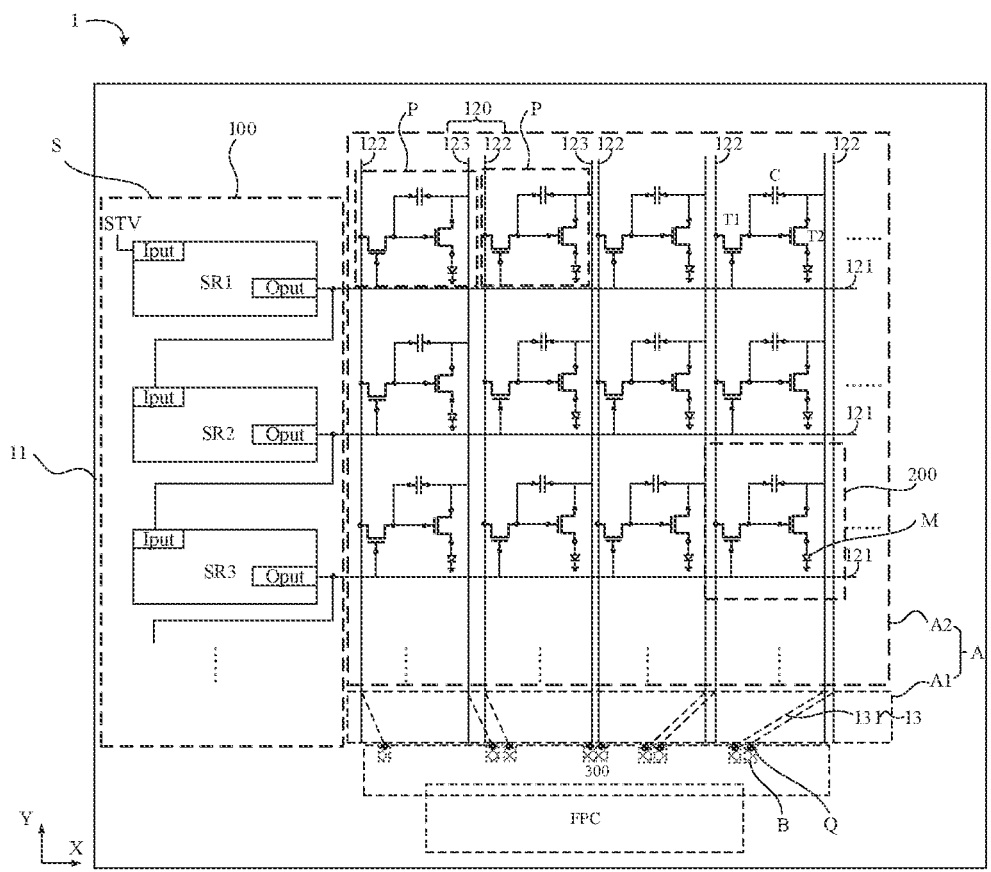
FIG. 1 is a top view showing a structure of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are interpreted as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" as used herein indicates an open and inclusive expression, which does not exclude devices that are applicable to or configured to perform additional tasks or steps.

As used herein, the term such as "about", "substantially" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of a measurement system).

Exemplary embodiments are described herein with reference to sectional views and/or plan views as idealized exemplary drawings. In the accompanying drawings, thicknesses of layers and sizes of regions are enlarged for clarity. Variations in shapes with respect to the accompanying drawings due to, for example, manufacturing technologies and/or tolerances may be envisaged. Therefore, the exemplary embodiments should not be construed to be limited to the shapes of the regions shown herein, but to include deviations in shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device and are not intended to limit the scope of the exemplary embodiments.

Large-sized or extra-large-sized display screens may be realized by tiling a plurality of small screens together. Considering an independent small-screen display panel as an example, as shown in FIG. 1, the display panel 1 has a display region A, and the display panel 1 includes a plurality of sub-pixels P located in the display region A. For convenience of description, in the embodiments of the present disclosure, the plurality of sub-pixels P are arranged in a form of a matrix, and sub-pixels P arranged in a line along a horizontal direction X are referred to as sub pixels in a same row, and sub-pixels P arranged in a line along a vertical direction Y are referred to as sub pixels in a same column. Each sub-pixel P includes a pixel circuit 200 and an element M to be driven electrically connected to the pixel circuit 200. The pixel circuit 200 is capable of driving the element M to be driven electrically connected thereto to emit light.

For example, the element M to be driven may be a light-emitting diode (LED). In this case, the display panel 1 may be a LED display panel. Alternatively, the element M to be driven may be an organic light-emitting diode (OLED). In this case, the display panel 1 may be an OLED display panel.

Figure 7:
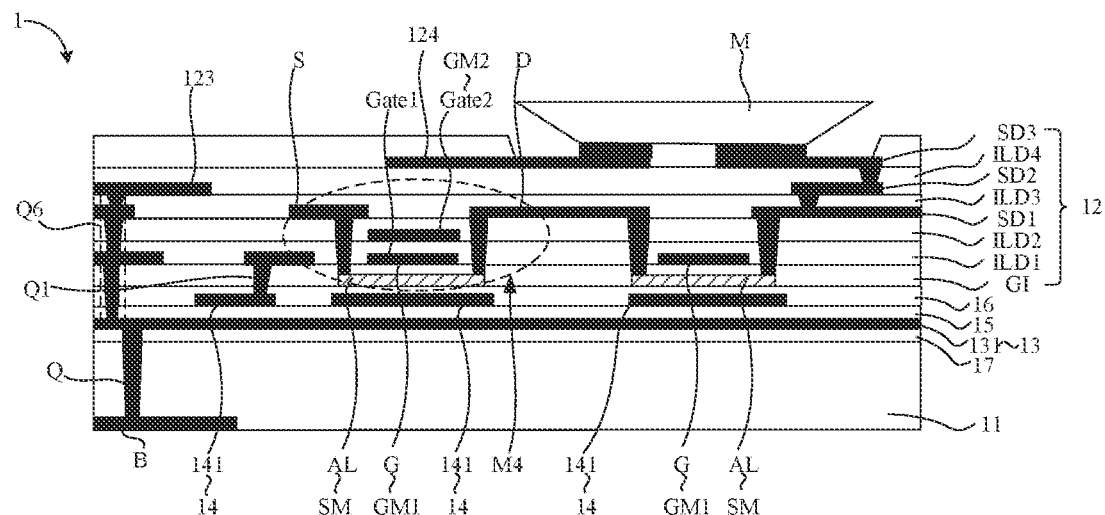
FIG. 7 is a sectional view showing a structure of a display panel, in accordance with some embodiments.

As shown in FIG. 7, the display panel 1 includes a base 11. A plurality of pixel circuits 200 are disposed on the base 11, and a plurality of elements M to be driven are disposed on a side of a film layer where the plurality of pixel circuits 200 are located away from the base 11.

It will be noted that, the film layer where the plurality of pixel circuits 200 are located is referred to as a pixel circuit layer 12. The pixel circuit layer 12 is disposed on the base 11 and is located in the display region A. The pixel circuit layer 12 includes the plurality of pixel circuits 200, and the plurality of elements M to be driven are disposed on a side of the pixel circuit layer 12 away from the base 11.

As shown in FIG. 1, the pixel circuit layer 12 further includes gate lines 121 extending in a certain direction (e.g., a row direction in which the plurality of sub-pixels P are arranged in an array), data lines 122 insulated from and intersecting the gate lines 121, and first power supply lines 123 (referring to FIGS. 1 and 7) that are all disposed on the base 11. In a case where the display panel 1 is the LED display panel, the pixel circuit layer 12 further includes second power supply lines 124 (referring to FIG. 7). The data lines 122 may be perpendicular to the gate lines 121. That is, the data lines 122 may extend in a column direction in which the plurality of sub-pixels P are arranged in an array. The first power supply lines 123 and the second power supply lines 124 may be parallel to the data lines 122.

The gate line 121 is electrically connected to the pixel circuit 200, and is configured to transmit a gate driving signal to the pixel circuit 200. The data line 122 is electrically connected to the pixel circuit 200, and is configured to transmit a data voltage signal Vdata to the pixel circuit 200. The first power supply line 123 is electrically connected to the pixel circuit 200, and is configured to transmit a first power supply voltage signal VDD to the pixel circuit 200. The second power supply line 124 is electrically connected to the element M to be driven, and is configured to transmit a second power supply voltage signal VSS to the element M to be driven.

Figure 2:
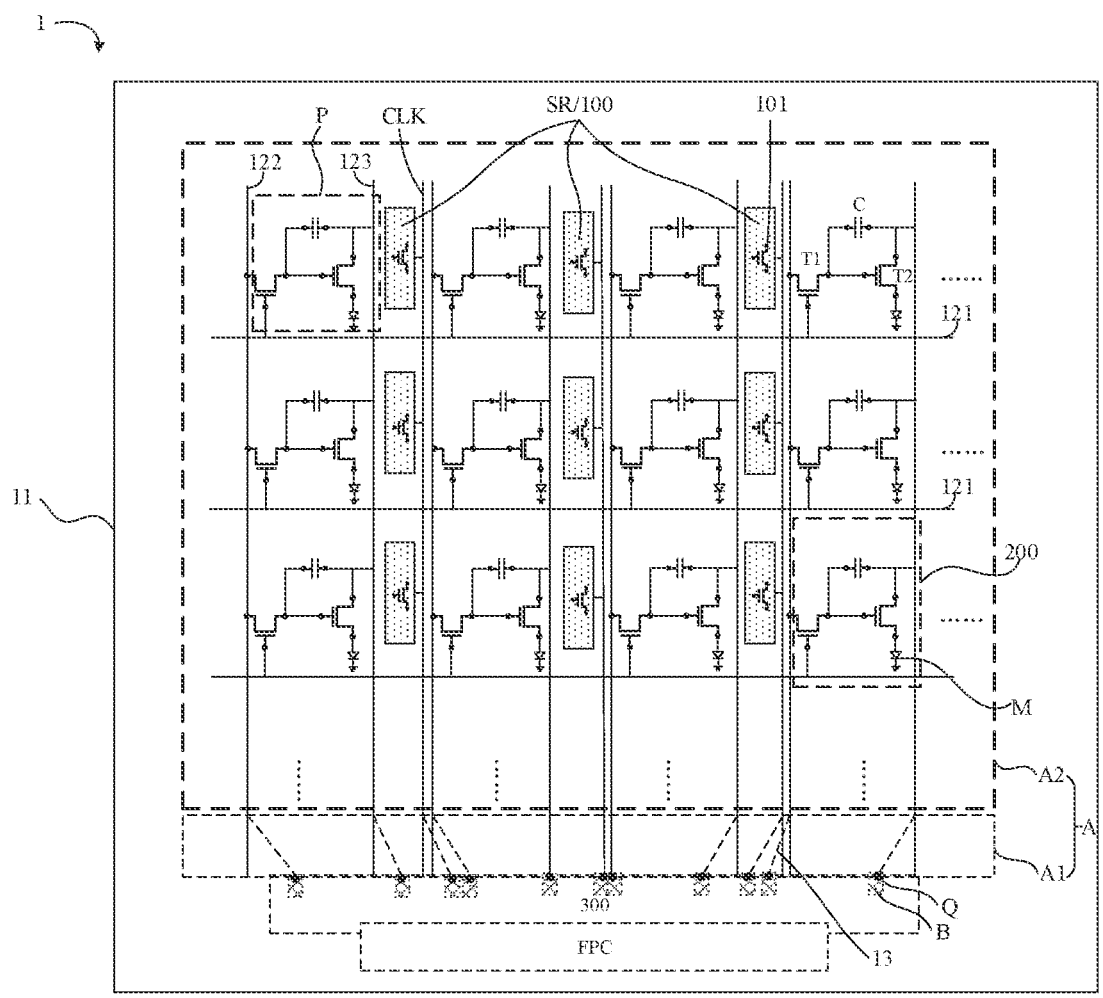
FIG. 2 is a top view showing a structure of another display panel, in accordance with some embodiments.

As shown in FIGS. 1 and 2, the pixel circuit 200 includes a plurality of transistors and at least one capacitor. The transistors may adopt a top-gate or bottom-gate structure. In a case where the transistor has a bottom-gate structure, the transistor includes a gate, a gate insulating layer, an active layer pattern, and a source-drain (including a source and a drain) that are sequentially arranged on the base. As shown in FIG. 7, in a case where the transistor has a top-gate structure, the transistor includes an active layer pattern AL, a gate insulating layer GI, a gate G, an interlayer insulating layer, and a source-drain (including a source S and a drain D) that are sequentially arranged on the base. The active layer pattern AL of the transistor may be made of amorphous silicon, monocrystalline silicon, polycrystalline silicon or oxide semiconductor. The active layer pattern AL includes a channel region that is not doped with any impurities, and a source region and a drain region that are formed by adding impurities, which are located on two sides of the channel region. The added impurities determine the switching type of the transistor. In a case where the added impurities are N-type impurities, the transistor is an N-type transistor; and in a case where the added impurities are P-type impurities, the transistor is a P-type transistor.

The capacitor includes a first electrode plate and a second electrode plate. An interlayer insulating layer is provided, as a dielectric, between the two electrode plates.

It will be noted that, a film layer where the active layer patterns AL of the transistors of the pixel circuit 200 are located is referred to as a semiconductor layer SM, a film layer where the gates G of the transistors of the pixel circuit 200 are located is referred to as a gate metal layer, and a film layer where the source-drains of the transistors of the pixel circuit 200 are located is referred to as a source-drain metal layer. As can be seen from the above, the pixel circuit layer 12 includes the semiconductor layer SM, the gate insulating layer GI, gate metal layer(s), interlayer insulating layer(s) and source-drain metal layer(s).

As shown in FIG. 7, the pixel circuit layer 12 includes two gate metal layers, which are a first gate metal layer GM1 and a second gate metal layer GM2. The first gate metal layer GM1 includes the gates G of the transistors, the first electrode plate of the capacitor, the gate lines 121 and light-emitting control signal lines 126 to be described below. The second gate metal layer GM2 includes the second electrode plate of the capacitor and initial voltage signal lines 125 to be described below.

As shown in FIG. 7, the pixel circuit layer 12 includes three source-drain metal layers, which are a first source-drain metal layer SD1, a second source-drain metal layer SD2 and a third source-drain metal layer SD3. The first source-drain metal layer SD1 includes the sources and drains of the transistors, the second source-drain metal layer SD2 includes the data lines 122 and the first power supply lines 123, and the third source-drain metal layer SD3 includes the second power supply lines 124.

On this basis, the pixel circuit layer 12 includes a plurality of interlayer insulating layers, which are: a first interlayer insulating layer ILD1 located between the first gate metal layer GM1 and the second gate metal layer GM2, a second interlayer insulating layer ILD2 located between the second gate metal layer GM2 and the first source-drain metal layer SD1, a third interlayer insulating layer ILD3 located between the first source-drain metal layer SD1 and the second source-drain metal layer SD2, and a fourth interlayer insulating layer ILD4 located between the second source-drain metal layer SD2 and the third source-drain metal layer SD3.

As shown in FIGS. 1 and 2, the electrical connection relationship between the pixel circuit 200 and external circuits is described by taking an example where the pixel circuit 200 has a 2T1C structure including two transistors (i.e., a switching transistor T1 and a driving transistor T2) and one capacitor C.

A gate of the switching transistor T1 is connected to a gate line 121, a source of the switching transistor T1 is connected to a data line 122, and a drain of the switching transistor T1 is connected to a gate of the driving transistor T2. A source of the driving transistor T2 is connected to a first power supply line 123, and a drain D of the driving transistor T2 is connected to a first electrode of an element M to be driven through a via. A second electrode of the element M to be driven is connected to a second power supply line 124. A first electrode plate of the capacitor C is connected to the gate of the driving transistor T2, and a second electrode plate of the capacitor C is connected to the source of the driving transistor T2.

The switching transistor T1 is turned on by a gate voltage applied to the gate line 121, thereby transmitting a data voltage applied to the data line 122 to the driving transistor T2. There is a certain difference between the data voltage transmitted from the switching transistor T1 to the driving transistor T2 and a common voltage applied from the first power supply line 123 to the driving transistor T2. A voltage corresponding to an absolute value of the difference is stored in the capacitor C, and a current corresponding to the voltage stored in the capacitor C flows into the element M to be driven through the driving transistor T2 and makes the element M to be driven emit light.

Figure 3A:
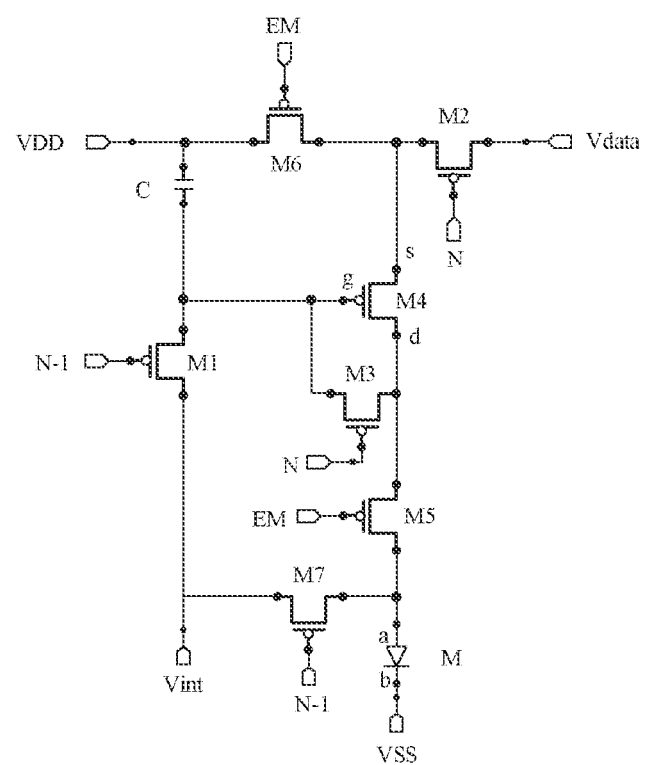
FIG. 3A is an equivalent circuit diagram of a pixel circuit, in accordance with some embodiments.
Figure 3B:
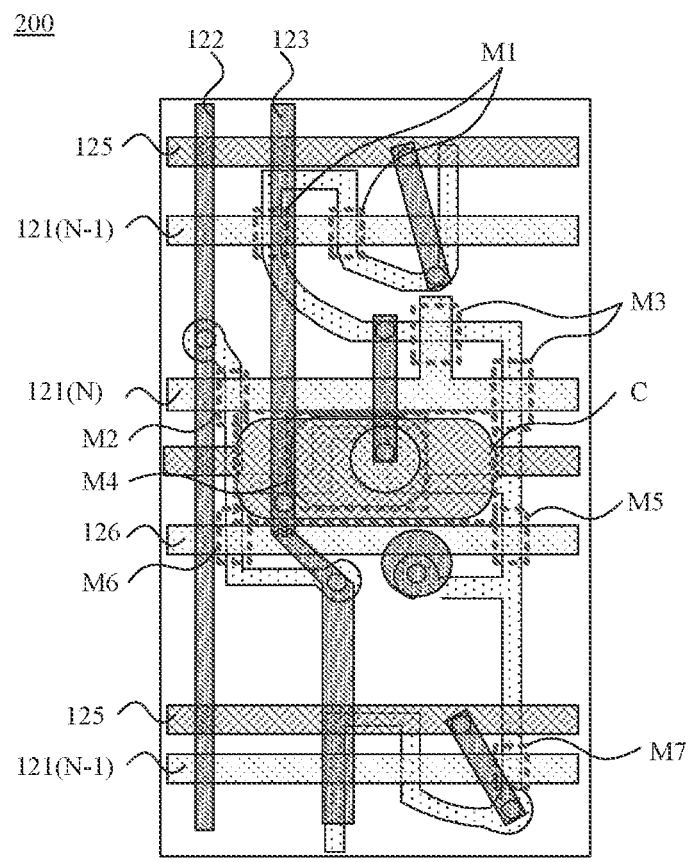
FIG. 3B is a diagram showing a structure of a pixel circuit, in accordance with some embodiments.

As shown in FIGS. 3A and 3B, the pixel circuit 200 may have a 7T1C structure including seven transistors (six switching transistors M1, M2, M3, M5, M6, M7 and one driving transistor M4) and one capacitor C.

On this basis, the pixel circuit layer of the display panel 1 further includes initial voltage signal lines 125 and light-emitting control signal lines 126, and the initial voltage signal lines 125 and the light-emitting control signal lines 126 may be parallel to the gate line 121. The initial voltage signal line 125 is electrically connected to the pixel circuit 200, and is configured to transmit an initial voltage signal Vint to the pixel circuit 200. The light-emitting control signal line 126 is electrically connected to the pixel circuit 200, and is configured to transmit a light-emitting control signal EM to the pixel circuit 200.

The initial voltage signal line 125 is disposed in a same layer as the second electrode plate of the capacitor C, and the light-emitting control signal line 126 is disposed in a same layer as the gate of the transistor.

A gate of the switching transistor M1 is connected to the gate line 121 (which provides a first gate signal N-1) of pixel circuits 200 in the previous row, a source of the switching transistor M1 is connected to a gate of the driving transistor M4, and a drain of the switching transistor M1 is connected to the initial voltage signal line 125.

A gate of the switching transistor M2 is connected to the gate line 121, a source of the switching transistor M2 is connected to a source of the driving transistor M4, and a drain of the switching transistor M2 is connected to the data line 122.

A gate of the switching transistor M3 is connected to the gate line 121, a source of the switching transistor M3 is connected to the gate of the driving transistor M4, and a drain of the switching transistor M3 is connected to a drain of the driving transistor M4.

A gate of the switching transistor M5 is connected to the light-emitting control signal line 126, a source of the switching transistor M5 is connected to the drain of the driving transistor M4, and a drain of the switching transistor M5 is connected to the first electrode of the element M to be driven.

A gate of the switching transistor M6 is connected to the light-emitting control signal line 126, a source of the switching transistor M6 is connected to the source of the driving transistor M4, and a drain of the switching transistor M6 is connected to the first power supply line 123.

A gate of the switching transistor M7 is connected to the gate line 121 of the pixel circuits 200 in the previous row, a source of the switching transistor M7 is connected to the initial voltage signal line 125, and a drain of the switching transistor M7 is connected to the first electrode of the element M to be driven. The second electrode of the element M to be driven is connected to the second power supply line 124 (referring to FIG. 7).

A first electrode plate of the capacitor C is connected to the source of the switching transistor M1, and a second electrode plate of the capacitor C is connected to the drain of the switching transistor M6.

Figure 4:
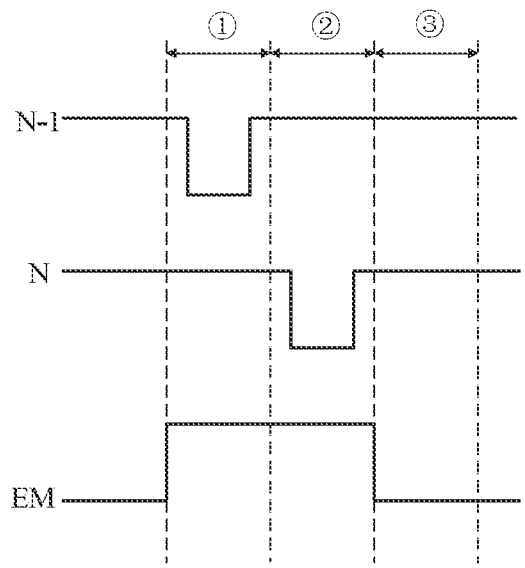
FIG. 4 is a timing diagram showing three working periods of a pixel circuit, in accordance with some embodiments.

As can be seen from the above, the gates of a part of the switching transistors (e.g., M1, M7) are configured to receive the first gate signal N-1 as shown in FIG. 4, the gates of another part of the switching transistors (e.g., M2, M3) are configured to receive the second gate signal N as shown in FIG. 4, and the gates of yet another part of the switching transistors (e.g., M5, M6) are configured to receive the light-emitting control signal EM as shown in FIG. 4.

It will be noted that, the working process of the pixel circuit 200 shown in FIG. 3A includes three periods: a first period ①, a second period ②, and a third period ③, as shown in FIG. 4.

In the first period ①, under the control of the first gate signal N-1, the switching transistor M1 and the switching transistor M7 are turned on. The initial voltage signal Vint is transmitted to the gate of the driving transistor M4 and the first electrode of the element M to be driven respectively through the switching transistor M1 and the switching transistor M7, so as to reset the first electrode of the element M to be driven and the gate of the driving transistor M4.

In the second period ②, under the control of the second gate signal N, the switching transistor M3 is turned on, so that the gate of the driving transistor M4 is electrically connected to the drain of the driving transistor M4, that is, the driving transistor M4 is in a diode on state. At this time, the data voltage signal Vdata is written to the source of the driving transistor M4 through the switching transistor M2, so as to compensate a threshold voltage Vth of the driving transistor M4.

In the third period ③, under the control of the light-emitting control signal EM, the switching transistor M5 and the switching transistor M6 are turned on, and a current path between the first power supply voltage signal VDD and the second power supply voltage signal VSS is formed. A driving current Isd produced by the driving transistor M4 is transmitted to the element M to be driven through the current path, so as to drive the element M to be driven to emit light.

As shown in FIGS. 2 and 7, the display panel 1 further has a fan-out lead region A1, the fan-out lead region A1 is located in the display region A. At least one pixel circuit 200 is located in the fan-out lead region A1.

The display panel 1 includes a plurality of fan-out leads 13. The plurality of fan-out leads 13 are disposed between the base 11 and the pixel circuit layer 12, and are located in the fan-out lead region A1.

It may be understood that, the plurality of fan-out leads 13 include signal leads that are electrically connected to the data lines 122, signal leads that are electrically connected to the first power supply lines 123, and signal leads that are electrically connected to the second power supply lines 124. Since the data lines 122 and the first power supply lines 123 are electrically connected to the pixel circuits 200, at least one fan-out lead 13 is electrically connected to the pixel circuits 200.

It will be noted that, a signal lead electrically connected to a first power supply line 123 is referred to as a first power supply fan-out lead 131, and a signal lead electrically connected to a second power supply line 124 is referred to as a second power supply fan-out lead 132. The plurality of fan-out leads 13 include first power supply fan-out leads 131 and second power supply fan-out leads 132. The first power supply fan-out lead 131 is configured to be electrically connected to a first power supply line 123, and the second power supply fan-out lead 132 is configured to be electrically connected to a second power supply line 124.

As shown in FIG. 7, the display panel 1 further includes an electric field shielding pattern 14. The electric field shielding pattern 14 is disposed between the pixel circuit layer 12 and a film layer where the plurality of fan-out leads 13 are located, and an orthographic projection of the electric field shielding pattern 14 on the base 11 covers at least orthographic projections of active layer patterns of transistors of the pixel circuit 200 located in the fan-out lead region A1 on the base 11, that is, at least the orthographic projections of the active layer patterns of the transistors of the pixel circuit 200 located in the fan-out lead region A1 on the base 11 are located within the orthographic projection of the electric field shielding pattern 14 on the base 11. The electric field shielding pattern 14 is configured to be applied with a constant voltage to shield an interference signal, from the plurality of fan-out leads 13, acting on the active layer patterns of the transistors located in the fan-out lead region A1.

It will be understood that, the electric field shielding pattern 14 is not in direct contact with the plurality of fan-out leads 13 and the pixel circuit layer 12, but is isolated from the plurality of fan-out leads 13 and the pixel circuit layer 12 by insulating layers. As shown in FIG. 7, a first insulating layer 15 is provided between the plurality of fan-out leads 13 and the electric field shielding pattern 14, and a second insulating layer 16 is provided between the electric field shielding pattern 14 and the pixel circuit layer 12.

It will be noted that, the reason why the electric field shielding pattern 14 is referred to as a pattern is that the electric field shielding pattern 14 is not an entire layer but has a certain pattern.

In some embodiments, a material of the electric field shielding pattern 14 includes a metal material.

The display panel 1 provided by the embodiments of the present disclosure includes the electric field shielding pattern 14 disposed between the pixel circuit layer 12 and the film layer where the plurality of fan-out leads 13 are located, and the orthographic projection of the electric field shielding pattern 14 on the base 11 covers at least the orthographic projections of the active layer patterns of the transistors of the pixel circuit 200 located in the fan-out lead region A1 on the base 11. By applying the constant voltage on the electric field shielding pattern 14, it may be possible to shield the interference signal, from the fan-out leads 13, acting on the active layer patterns of the transistors in the fan-out lead region A1, and create a same physical environment for the active layer patterns of the transistors in the fan-out lead region A1, so that the transistors located in the fan-out lead region A1 work in the same physical environment. In this way, it may be possible to avoid the problem of bad properties and poor uniformity of the transistors located in the fan-out lead region A1 caused by different physical environments.

In some embodiments, the constant voltage is 0V, which may further improve the stability of the physical environment in which the transistors are located, and avoid the difference in properties of the transistors under a constant voltage other than 0V. In addition, it may also be possible to prevent the constant voltage other than 0V from causing signal interference to the data lines 122 and the first power supply lines 123.

In some embodiments, a region of the display region A other than the fan-out lead region A1 is referred to as a main display region A2, and the orthographic projection of the electric field shielding pattern 14 on the base 11 further covers orthographic projections of active layer patterns of transistors of pixel circuits 200 located in the main display region A2 on the base 11, that is, the orthographic projections of the active layer patterns of the transistors of the pixel circuits 200 located in the main display region A2 on the base 11 are located within the orthographic projection of the electric field shielding pattern 14 on the base 11. This arrangement may create a same physical environment for the active layer patterns of the transistors of all pixel circuits 200 located in the display region A, so that the transistors of the pixel circuits 200 located in the display region A may work in the same physical environment. In this way, it may be possible to avoid the problem of bad properties and poor uniformity of the transistors of the pixel circuits 200 located in the display region A caused by different physical environments.

In some embodiments, the display panel 1 further includes gate driving circuits 100. The gate driving circuits 100 are electrically connected to the plurality of pixel circuits 200, and are configured to provide gate driving signals to the plurality of pixel circuits 200. As shown in FIG. 2, the gate driving circuit 100 includes a plurality of transistors 101.

For example, as shown in FIG. 2, the gate driving circuit 100 is disposed in the display region A. Alternatively, as shown in FIG. 1, the display panel 1 further has a peripheral region S disposed around the display region A, and the gate driving circuit 100 is disposed in the peripheral region S.

As shown in FIG. 1, considering an example where the gate driving circuit 100 is disposed in the peripheral region S, the gate driving circuit 100 includes a plurality of shift registers (SR). A signal output terminal (OUTput, Oput for short) of each shift register SR is electrically connected to a gate line 121, and may provide a gate driving signal to the gate of at least one transistor in each sub-pixel P of a row of sub-pixels P.

In this case, if the plurality of shift registers SR are cascaded in sequence, for example, as shown in FIG. 1, a signal output terminal Oput of a first-stage shift register SR1 is connected to a signal input terminal (INput, Iput for short) of a second-stage shift register SR2. The second-stage shift register SR2 is adjacent to the first-stage shift register SR1.

A signal output terminal Oput of the second-stage shift register SR2 is connected to a signal input terminal Iput of a third-stage shift register SR3. The third-stage shift register SR3 is adjacent to the second-stage shift register SR2.

In addition, remaining shift registers SR are cascaded in the same manner as described above.

A signal input terminal Iput of the first-stage shift register SR1 is used to receive a start vertical frame signal Stv. When the start vertical frame signal Stv is at a high voltage, the start vertical frame signal Stv is an active signal, and the first-stage shift register SR1 is turned on.

When the start vertical frame signal Stv is at a low voltage, the start vertical frame signal Stv is an inactive signal, and the first-stage shift register SR1 does not work at this time.

Based on this, the first-stage shift register SR1 provides a gate driving signal to the gates of the transistors, in a first row of sub-pixels P, connected to the signal output terminal Oput of the first-stage shift register SR1. At the same time, the first-stage shift register SR1 further provides a start vertical frame signal to the signal input terminal Iput of the second-stage shift register SR2, so that the second-stage shift register SR2 is turned on.

Next, the second-stage shift register SR2 provides a gate driving signal to the gates of the transistors, in a second row of sub-pixels P, connected to the signal output terminal Oput of the second-stage shift register SR2. At the same time, the second-stage shift register SR2 further provides a start vertical frame signal to the signal input terminal Iput of the third-stage shift register SR3, so that the third-stage shift register SR3 is turned on.

Next, the third-stage shift register SR3 provides a gate driving signal to the gates of the transistors, in a third row of sub-pixels P, connected to a signal output terminal Oput of the third-stage shift register SR3. At the same time, the third-stage shift register SR3 further provides a start vertical frame signal to a signal input terminal Iput of a stage of shift register cascaded with the third-stage shift register SR3. In this way, through the plurality of cascaded shift registers SR, it may be possible to scan a plurality of rows of sub-pixels P arranged in sequence row by row.

It will be noted that, the above descriptions are all made by taking an example where a stage of shift register SR controls one row (or one column) of sub-pixels for display in the gate driving circuit 100. In some other embodiments of the present disclosure, a stage of shift register SR may control at least two rows (or columns) of sub-pixels for display. An internal structure of the shift register SR is not limited in the embodiments of the present disclosure.

Figure 5:
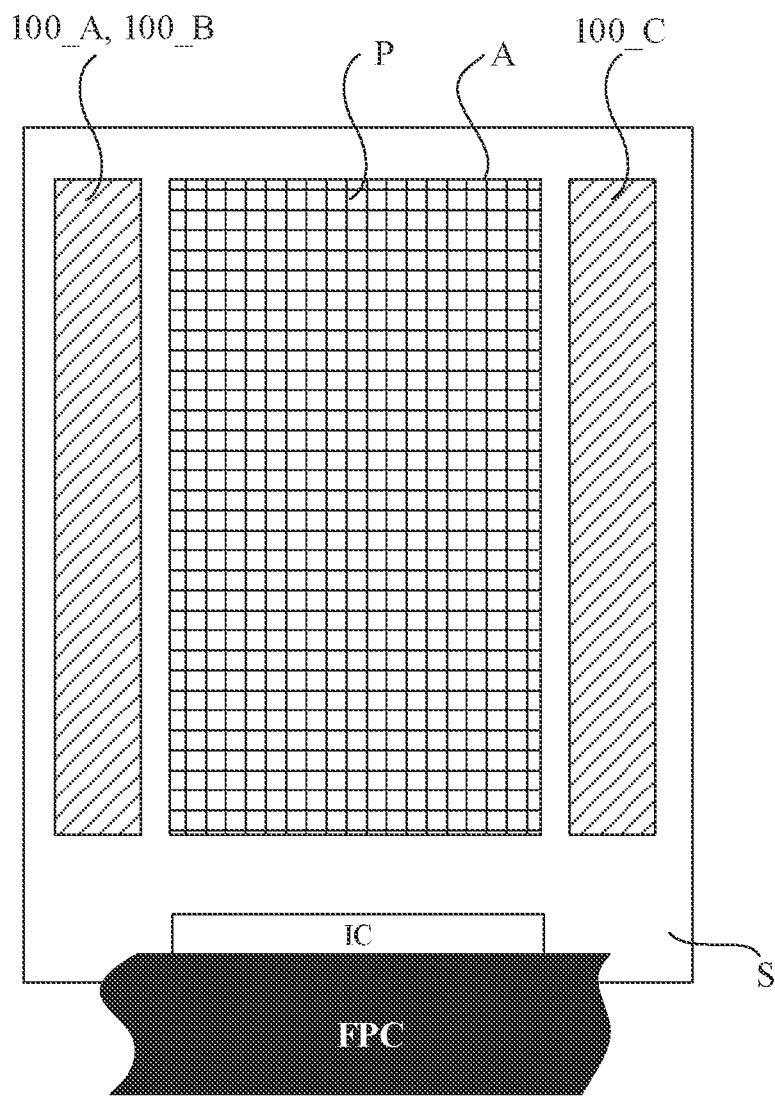
FIG. 5 is a diagram showing a structure of a display panel including three types of gate driving circuits, in accordance with some embodiments.

As for the pixel circuit 200 having a 7T1C structure, as shown in FIG. 5, the display panel 1 includes three types of gate driving circuits 100 located in the peripheral region S, respectively: a gate driving circuit 100_A used for outputting the first gate signals N-1, a gate driving circuit 100_B used for outputting the second gate signals N, and a gate driving circuit 100_C used for outputting the light-emitting control signals EM.

Figure 6:
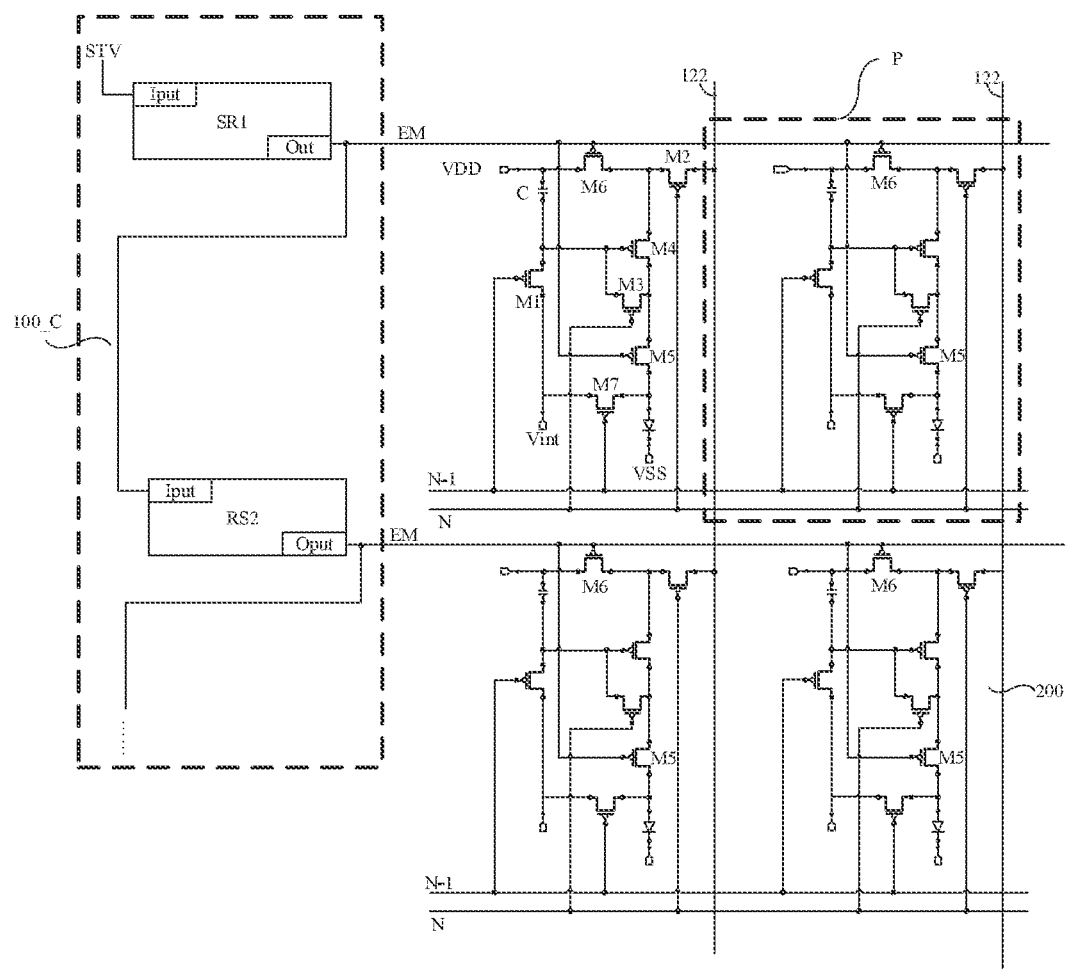
FIG. 6 is a diagram showing a structure of an electrical connection between a gate driving circuit 100_C and a pixel circuit, in accordance with some embodiments.

Based on this, as shown in FIG. 6, the gates of the switching transistors M5 and M6 in the pixel circuits 200 of the same row of sub-pixels P may be connected to a signal output terminal Oput of a stage of shift register SR in the gate driving circuit 100_C.

In addition, similarly, the gates of the switching transistors M1 and M7 may be connected to a signal output terminal Oput of a stage of shift register SR in the gate driving circuit 100_A. The gates of the switching transistors M2 and M3 may be connected to a signal output terminal Oput of a stage of shift register SR in the gate driving circuit 100_B.

As can be seen from the above, since the plurality of shift registers SR in the gate driving circuit 100 are cascaded in sequence, in an image frame, the shift registers SR in the gate driving circuit 100 may output gate driving signals one by one through respective signal output terminals Oput. In this case, after the first row of sub-pixels P are scanned, remaining rows of sub-pixels P are scanned row by row, so that all the sub-pixels P in the entire display region A display an frame of image together.

It may be understood that, as shown in FIGS. 1 and 2, the plurality of fan-out leads 13 further include a signal lead electrically connected to a start vertical frame signal line STV of the gate driving circuit 100, and signal leads electrically connected to clock signal lines CLK of the gate driving circuit 100.

On this basis, the orthographic projection of the electric field shielding pattern 14 on the base 11 further covers orthographic projections of active layer patterns of the transistors of the gate driving circuits 100 on the base 11, that is, the orthographic projections of the active layer patterns of the transistors of the gate driving circuits 100 on the base 11 are within the orthographic projection of the electric field shielding pattern 14 on the base 11. This arrangement may create a same physical environment for the active layer patterns of all the transistors of the display panel 1, so that the transistors of the display panel 1 work in the same physical environment. In this way, it may be possible to avoid the problem of bad properties and poor uniformity of the transistors of the display panel 1 caused by different physical environments.

In some embodiments, the pixel circuit layer 12 includes first signal lines 120. The first signal line 120 extends to the fan-out lead region A1 and is electrically connected to a pixel circuit 200 located in the fan-out lead region A1.

For example, as shown in FIGS. 1 and 2, the data line 122 and the first power supply line 123 extend to the fan-out lead region A1 and are electrically connected to the pixel circuit 200 located in the fan-out lead region A1. That is, the first signal lines 120 include the data line 122 and the first power supply line 123.

On this basis, the orthographic projection of the electric field shielding pattern 14 on the base 11 further covers orthographic projections of portions, extending to the fan-out lead region A1, of the first signal lines 120 on the base 11. That is, the orthographic projections of the portions, extending to the fan-out lead region A1, of the first signal lines 120 on the base 11 are within the orthographic projection of the electric field shielding pattern 14 on the base 11. This arrangement may shield the interference signal of the fan-out leads 13 acting on the portion of the first signal line 120 located in the fan-out lead region A1.

In order to apply the constant voltage to the electric field shielding pattern 14, in some embodiments, the electric field shielding pattern 14 is electrically connected to the gate G of the driving transistor M4 through a first via Q1 located in insulating layers between the film layer where the gate G of the driving transistor M4 is located and the electric field shielding pattern 14. Since in the light-emitting period, that is, in the third period ③, the gate voltage of the driving transistor M4 is constant (that is, Vdata+Vth), by electrically connecting the electric field shielding pattern 14 to the gate G of the driving transistor M4, the electric field shielding pattern 14 may be applied with the constant voltage, and the function of signal shielding may be realized.

For example, as shown in FIG. 7, the film layer where the gate G of the driving transistor M4 is located is a first gate metal layer GM1, the first via Q1 penetrates the second insulating layer 16 and the gate insulating layer GI that are located between the first gate metal layer GM1 and the electric field shielding pattern 14, and the electric field shielding pattern 14 is electrically connected to the gate G of the driving transistor M4 through the first via Q1.

It will be noted that, although in FIG. 7, the gate G of the driving transistor M4 is disconnected, it is actually connected, and the portion connected to the electric field shielding pattern 14 is a portion of the gate G of the driving transistor M4 that does not overlap with the active layer pattern AL.

In some embodiments, the electric field shielding pattern 14 is electrically connected to the source or the drain of the driving transistor through a second via Q2 located in insulating layers between the film layer where the source S and the drain D of the driving transistor M4 are located and the electric field shielding pattern 14. Since in the light-emitting period, that is, in the third period ②, the voltages of the source S and the drain D of the driving transistor M4 are both the first power supply voltage signal VDD, by electrically connecting the electric field shielding pattern 14 to the source S or the drain D of the driving transistor M4, the electric field shielding pattern 14 may be applied with the constant voltage, and the function of signal shielding may be realized.

Figure 8:
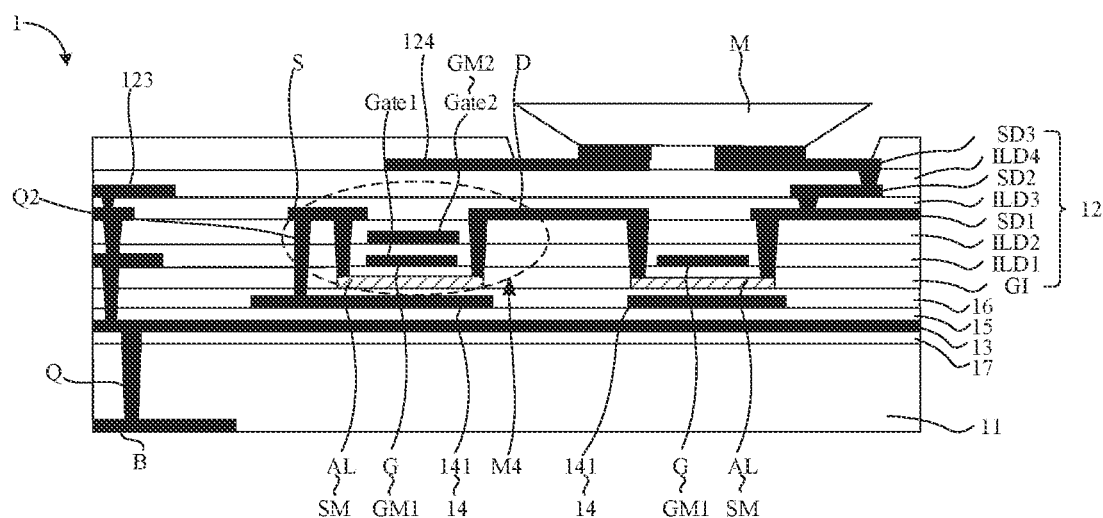
FIG. 8 is a sectional view showing a structure of another display panel, in accordance with some embodiments.

For example, as shown in FIG. 8, the film layer where the source S and the drain D of the driving transistor M4 are located is the first source-drain metal layer SD1, and the second via Q2 penetrates the second insulating layer 16, the gate insulating layer GI, the first interlayer insulating layer ILD1 and the second interlayer insulating layer ILD2 that are between the first source-drain metal layer SD1 and the electric field shielding pattern 14. The electric field shielding pattern 14 is electrically connected to the source S or the drain D of the driving transistor M4 through the second via Q2.

In some embodiments, the electric field shielding pattern 14 is electrically connected to the first power supply line 123 through a third via Q3 located in insulating layers between the film layer where the first power supply line 123 is located and the electric field shielding pattern 14. The electric field shielding pattern 14 is applied with the constant voltage (that is, the first power supply voltage signal VDD) through the first power supply line 123, so as to realize the function of signal shielding.

Figure 9:
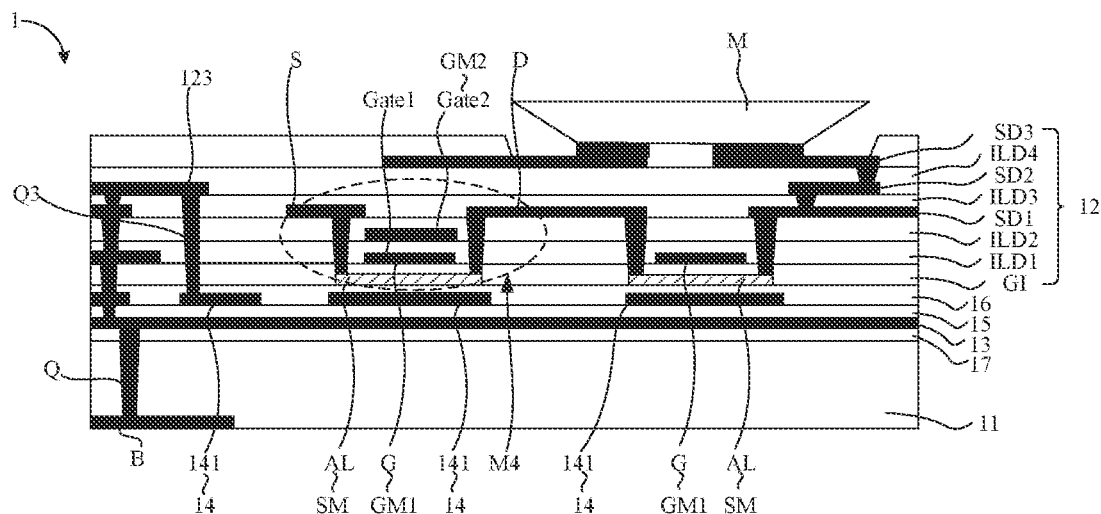
FIG. 9 is a sectional view showing a structure of yet another display panel, in accordance with some embodiments.

For example, as shown in FIG. 9, the film layer where the first power supply line 123 is located is the second source-drain metal layer SD2, and the third via Q3 penetrates the second insulating layer 16, the gate insulating layer GI, the first interlayer insulating layer ILD1, the second interlayer insulating layer ILD2 and the third interlayer insulating layer ILD3 that are between the second source-drain metal layer SD2 and the electric field shielding pattern 14. The electric field shielding pattern 14 is electrically connected to the first power supply line 123 through the third via Q3.

In some embodiments, the electric field shielding pattern 14 is electrically connected to the second power supply line 124 through a fourth via Q4 located in insulating layers between the film layer where the second power supply line 124 is located and the electric field shielding pattern 14. The electric field shielding pattern 14 is applied with the constant voltage (that is, the second power supply voltage signal VSS) through the second power supply line 124, so as to realize the function of signal shielding.

Figure 11:
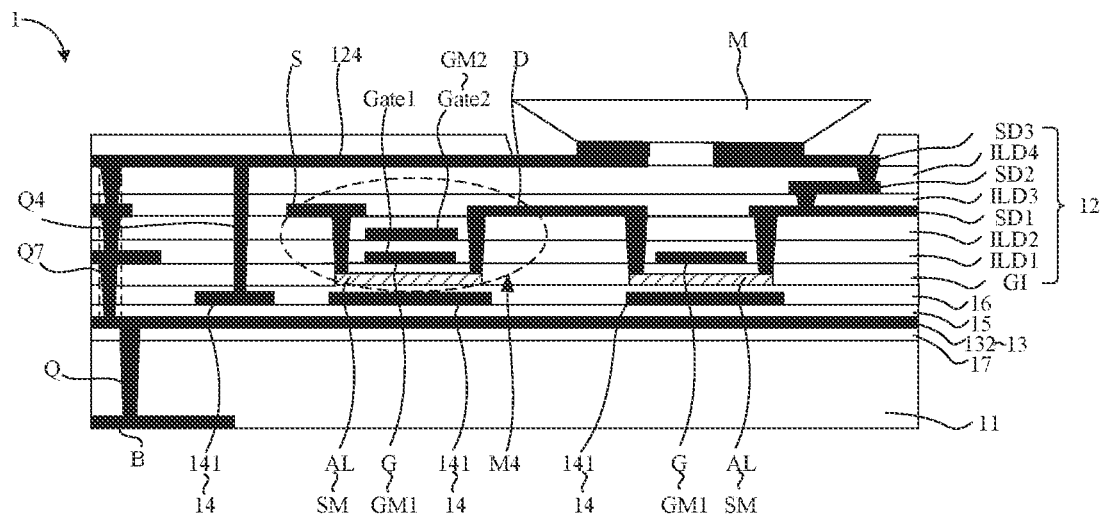
FIG. 11 is a sectional view showing a structure of yet another display panel, in accordance with some embodiments.

For example, as shown in FIG. 11, the film layer where the second power supply line 124 is located is the third source-drain metal layer SD3, and the fourth via Q4 penetrates the second insulating layer 16, the gate insulating layer GI, the first interlayer insulating layer ILD1, the second interlayer insulating layer ILD2, the third interlayer insulating layer ILD3 and the fourth interlayer insulating layer ILD4 that are between the third source-drain metal layer SD3 and the electric field shielding pattern 14. The electric field shielding pattern 14 is electrically connected to the second power supply line 124 through the fourth via Q4.

In some embodiments, the electric field shielding pattern 14 is electrically connected to the first power supply fan-out lead 131 or the second power supply fan-out lead 132 through a fifth via Q5 located in an insulating layer between the film layer where the plurality of fan-out leads 13 are located and the electric field shielding pattern 14. Since the first power supply fan-out lead 131 is electrically connected to the first power supply line 123, and the second power supply fan-out lead 132 is electrically connected to the second power supply line 124, the first power supply line 123 may provide the first power supply voltage signal VDD to the electric field shielding pattern 14 through the first power supply fan-out lead 131, or the second power supply line 124 may provide the second power supply voltage signal VSS to the electric field shielding pattern 14 through the second power supply fan-out lead 132, so as to apply the constant voltage to the electric field shielding pattern 14.

Figure 10:
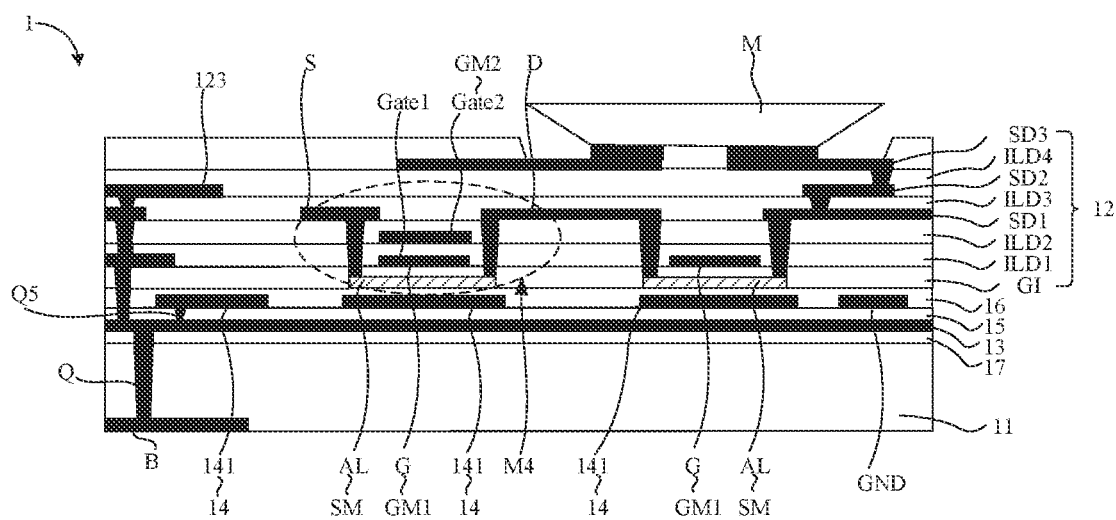
FIG. 10 is a sectional view showing a structure of yet another display panel, in accordance with some embodiments.

For example, as shown in FIG. 10, the first insulating layer 15 is provided between the plurality of fan-out leads 13 and the electric field shielding pattern 14. The fifth via Q5 penetrates the first insulating layer 15, and the electric field shielding pattern 14 is electrically connected to the first power supply fan-out lead 131 or the second power supply fan-out lead 132 through the fifth via Q5.

In some embodiments, as shown in FIG. 10, the display panel 1 further includes a ground line GND. The ground line GND is disposed between the pixel circuit layer 12 and the film layer where the plurality of fan-out leads 13 are located. That is, the ground line GND is disposed in a same layer as the electric field shielding pattern 14. The electric field shielding pattern 14 is electrically connected to the ground line GND, so that the electric field shielding pattern 14 is applied with the constant voltage of 0V.

In order to realize the electrical connection between the first power supply fan-out lead 131 and the first power supply line 123 and the electrical connection between the second power supply fan-out lead 132 and the second power supply line 124, in some embodiments, the first power supply fan-out lead 131 is electrically connected to the first power supply line 123 through a sixth via Q6 in insulating layers between the film layer where the first power supply line 123 is located and the film layer where the plurality of fan-out leads 13 are located, and the second power supply fan-out lead 132 is electrically connected to the second power supply line 124 through a seventh via Q7 in insulating layers between the film layer where the second power supply line 124 is located and the film layer where the plurality of fan-out leads 13 are located.

For example, as shown in FIG. 7, the film layer where the first power supply line 123 is located is the second source-drain metal layer SD2. The sixth via Q6 penetrates the first insulating layer 15, the second insulating layer 16, the gate insulating layer GI, the first interlayer insulating layer ILD1, the second interlayer insulating layer ILD2 and the third interlayer insulating layer ILD3 that are between the second source-drain metal layer SD2 and the plurality of fan-out leads 13. The first power supply fan-out lead 131 is electrically connected to the first power supply line 123 through the sixth via Q6.

As shown in FIG. 11, the film layer where the second power supply line 124 is located is the third source-drain metal layer SD3. The seventh via Q7 penetrates the first insulating layer 15, the second insulating layer 16, the gate insulating layer GI, the first interlayer insulating layer ILD1, the second interlayer insulating layer ILD2, the third interlayer insulating layer ILD3 and the fourth interlayer insulating layer ILD4 that are between the third source-drain metal layer SD3 and the plurality of fan-out leads 13. The second power supply fan-out lead 132 is electrically connected to the second power supply line 124 through the seventh via Q7.

In some embodiments, in a case where the electric field shielding pattern 14 is electrically connected to the first power supply line 123, the first power supply fan-out lead 131 is electrically connected to the electric field shielding pattern 14 through the fifth via Q5 located in the insulating layer between the electric field shielding pattern 14 and the film layer where the plurality of fan-out leads 13 are located. In a case where the electric field shielding pattern 14 is electrically connected to the second power supply line 124, the second power supply fan-out lead 132 is electrically connected to the electric field shielding pattern 14 through the fifth via Q5 located in the insulating layer between the electric field shielding pattern 14 and the film layer where the plurality of fan-out leads 13 are located.

For example, the electric field shielding pattern 14 is electrically connected to the first power supply line 123, and the first power supply fan-out lead 131 is electrically connected to the electric field shielding pattern 14 through the fifth via Q5, so as to realize the electrical connection between the first power supply fan-out lead 131 and the first power supply line 123.

The electric field shielding pattern 14 is electrically connected to the second power supply line 124, and the second power supply fan-out lead 132 is electrically connected to the electric field shielding pattern 14 through the fifth via Q5, so as to realize the electrical connection between the second power supply fan-out lead 132 and the second power supply line 124.

Figure 12:
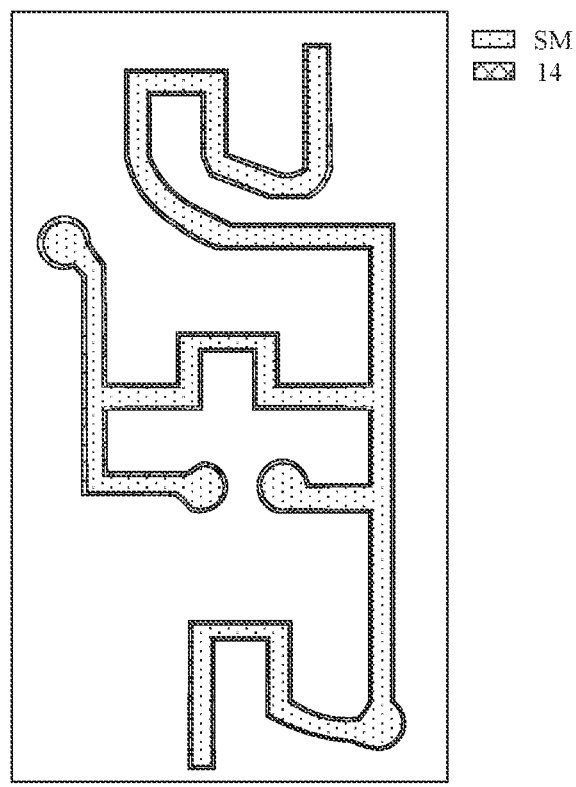
FIG. 12 is a plan view showing a structure of an electrical field shielding pattern, in accordance with some embodiments.

In some embodiments, the electric field shielding pattern 14 has a continuous structure. In this case, as shown in FIG. 12, a shape of the electric field shielding pattern 14 is substantially the same as a shape of the semiconductor layer SM. That is, a contour line of the orthographic projection of the electric field shielding pattern 14 on the base 11 substantially coincides with a contour line of the orthographic projection of the semiconductor layer SM on the base 11.

In some embodiments, the orthographic projection of the electric field shielding pattern 14 on the base 11 and at least part of a region, except for the orthographic projections of the active layer patterns of the plurality of pixel circuits 200 on the base 11, of the display panel are staggered from each other. For example, the orthographic projection of the electric field shielding pattern 14 on the base 11 only covers the orthographic projections of the active layer patterns of the plurality of pixel circuits 200 on the base 11. That is, only the orthographic projections of the active layer patterns of the plurality of pixel circuits 200 on the base 11 are located within the orthographic projection of the electric field shielding pattern 14 on the base 11. In this case, the orthographic projection of the electric field shielding pattern 14 on the base 11 and all of the region except for the orthographic projections of the active layer patterns of the plurality of pixel circuits 200 on the base 11 are staggered from each other. That is, they do not overlap.

For example, the orthographic projection of the electric field shielding pattern 14 on the base 11 covers the orthographic projections of the active layer patterns of the plurality of pixel circuits 200 on the base 11 and the orthographic projections of the active layer patterns of the gate driving circuits 100 on the base 11. That is, the orthographic projections of the active layer patterns of the plurality of pixel circuits 200 on the base 11 and the orthographic projections of the active layer patterns of the gate driving circuits 100 on the base 11 are both located within the orthographic projection of the electric field shielding pattern 14 on the base 11. In this case, the orthographic projection of the electric field shielding pattern 14 on the base 11 and part of the region except for the orthographic projections of the active layer patterns of the plurality of pixel circuits 200 on the base 11 are staggered from each other. It can be understood that, the part of the region refers to a region that does not overlap with the orthographic projections of the active layer patterns of the plurality of pixel circuits 200 on the base 11 and the orthographic projections of the active layer patterns of the gate driving circuits 100 on the base 11.

In some embodiments, the electric field shielding pattern 14 includes a plurality of electric field shielding electrodes 141 arranged separately, and each pixel circuit 200 located in the fan-out lead region A1 corresponds to an electric field shielding electrode 141.

The electric field shielding electrode 14 is electrically connected to a gate, a source or a drain of a driving transistor of a corresponding pixel circuit 200, or is electrically connected to a first power supply line 123 that is electrically connected to the corresponding pixel circuit 200, or is electrically connected to a second power supply line 124 that is electrically connected to an element M to be driven by the corresponding pixel circuit 200. The constant voltage is applied to the electric field shielding pattern 14 through the gate, the source, or the drain of the driving transistor M4, the first power supply line 123 or the second power supply line 124 of the corresponding pixel circuit 200.

In some embodiments, the electric field shielding pattern 14 includes a plurality of electric field shielding electrodes 141 arranged separately, and each transistor located in the fan-out lead region A1 corresponds to an electric field shielding electrode 141. The electric field shielding electrode 141 is electrically connected to a gate, a source or a drain of a corresponding transistor, so that the constant voltage is applied to the electric field shielding electrode 141 through the gate, the source or the drain of the corresponding transistor.

In some embodiments, the display panel 1 further includes connection elements B. The connection elements B are disposed on a side of the base 11 away from the plurality of fan-out leads 13 and are electrically connected to the plurality of fan-out leads 13.

Figure 13:
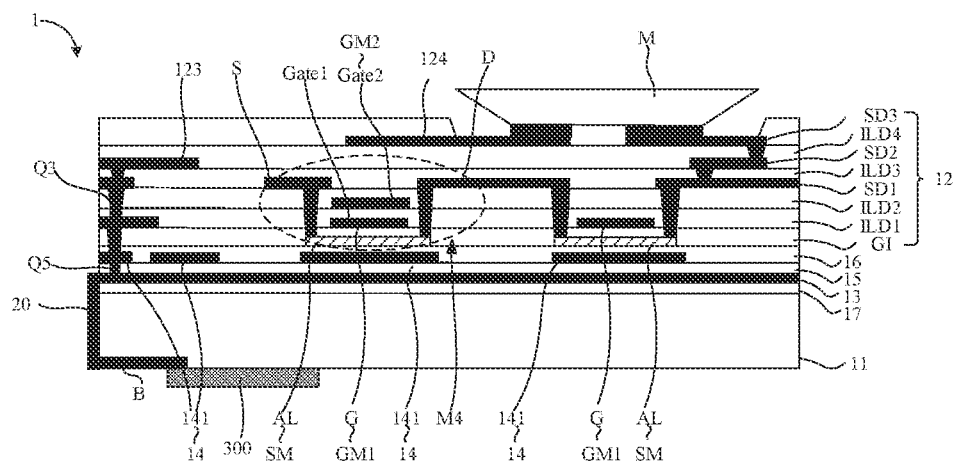
FIG. 13 is a sectional view showing a structure of yet another display panel, in accordance with some embodiments.

For example, as shown in FIG. 13, the display panel 1 further includes a plurality of side traces 20. The plurality of side traces 20 extend from the fan-out lead region A1 to a side of the base 11 away from the plurality of fan-out leads 13 through a side surface of the base 11. Each fan-out lead 13 is electrically connected to a connection element B through a side trace 20, so as to realize the electrical connection between the plurality of fan-out leads 13 and the connection elements B.

For example, as shown in FIG. 7, a plurality of eighth vias are provided in the base 11, and the plurality of fan-out leads 13 are electrically connected to the connection elements B through the plurality of eighth vias Q. That is, each fan-out lead 13 is electrically connected to a connection element B through the eighth via Q, so as to realize the electrical connection between the plurality of fan-out leads 13 and the connection elements B.

In some embodiments, the display panel 1 further includes a driving circuit 300, and the driving circuit 300 is disposed on the side of the base 11 away from the plurality of fan-out leads 13. The driving circuit 300 is electrically connected to the connection elements B, and is configured to provide the pixel circuits 200 with the data voltage signals Vdata and the first power supply voltage signal VDD.

The driving circuit 300 is electrically connected to the connection elements B, the connection elements B are electrically connected to the plurality of fan-out leads 13, and at least one fan-out lead 13 is electrically connected to the pixel circuits 200. As a result, the driving circuit 300 may be electrically connected to the pixel circuits 200 through the connection elements B and the fan-out leads 13, so as to provide the data voltage signals Vdata and the first power supply voltage signal VDD to the pixel circuits 200.

In some embodiments, the display panel 1 further includes a flexible printed circuit (FPC). The FPC is disposed on the side of the base 11 away from the plurality of fan-out leads 13 and is electrically connected to the connection elements B.

In the embodiments of the present disclosure, the connection elements B are electrically connected to the driving circuit 300 and the FPC, so that it may be possible to use the plurality of fan-out leads 13 to provide the gate driving circuits 100 and the pixel circuits 200 with corresponding driving signals, so as to drive the display panel 1 to display an image.

In the embodiments of the present disclosure, the fan-out leads 13 and the connection elements B are formed on opposite sides of the base 11. Compared with the solution of forming the fan-out leads 13 and the connection elements B on the same side of the base 11 and providing a special bonding region in the related art, the fan-out lead region A1 is located in the display region A, so that it may be possible to electrically connect the driving circuit 300 and the FPC to the connection elements B, and thus realize the narrow-bezel design of the display panel 1. Moreover, in a case where the display panel is applied to a tiled screen, it may be possible to greatly reduce the gap between the tiles and improve the display effect.

Figure 16:
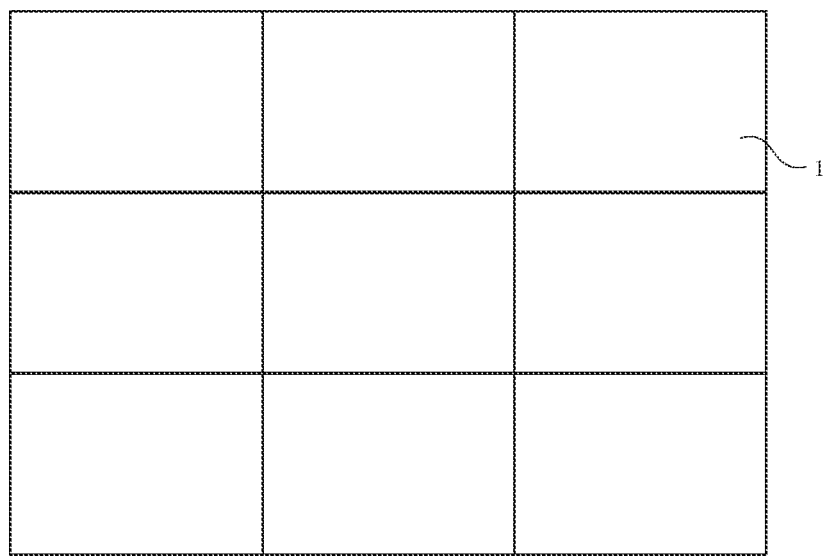
FIG. 16 is a diagram showing a structure of a tiled screen, in accordance with some embodiments.

Embodiments of the present disclosure further provide a tiled screen 1000. As shown in FIG. 16, the tiled screen 1000 includes a plurality of display panels 1. The plurality of display panels 1 are tiled together, and at least one of the plurality of display panels 1 is the display panel 1 according to the above embodiments.

As for the structure of the display panel 1 provided in the above embodiments, a method for manufacturing the display panel 1 provided by the embodiments of the present disclosure will be exemplarily described below by considering the display panel 1 shown in FIGS. 7, 8, 9 and 10 as an example.

Embodiments of the present disclosure further provide a method for manufacturing a display panel 1. The display panel 1 has a display region A and a fan-out lead region A1, and the fan-out lead region A1 is located in the display region A. The method includes the following steps (S01 to S04 and S1 to S3).

Figure 15:
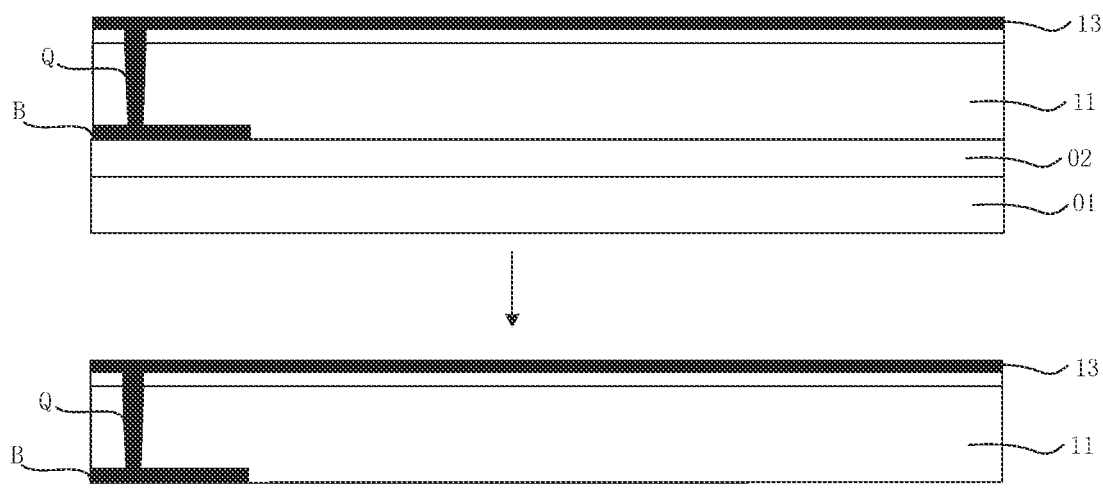
FIG. 15 is a flow diagram of forming a fan-out lead and a connection element on opposite sides of a base, in accordance with some embodiments.

In S01, as shown in FIG. 15, a sacrificial layer 02 is formed on a substrate 01, and connection elements B is formed on the sacrificial layer 02.

In S02, a base 11 is formed on a side of the connection elements B away from the substrate 01.

In some embodiments, the substrate 01 may be a glass substrate, and a material of the base 11 may be polyimide (PI).

In S03, a plurality of fan-out leads 13 are formed on the base 11, and the plurality of fan-out leads 13 are electrically connected to the connection elements B.

As shown in FIGS. 7 and 13, the connection elements B may be electrically connected to the plurality of fan-out leads 13 through a plurality of side traces 20, or may be electrically connected to the plurality of fan-out leads 13 through a plurality of eighth vias Q provided in the base 11.

In a case where the plurality of fan-out leads 13 and the connection elements B are electrically connected through the plurality of side traces 20, before the fan-out leads 13 are formed on the base 11, the plurality of side traces 20 may be formed by inkjet printing or screen printing.

In a case where the plurality of fan-out leads 13 and the connection elements B are electrically connected through the eighth vias Q provided in the base 11, before the fan-out leads 13 are formed on the base 11, the eighth vias Q may be formed in the base 11 through a patterning process, and then the plurality of fan-out leads 13 and the connection elements B are electrically connected through the eighth vias Q.

In a case where the fan-out leads 13 and the connection elements B are electrically connected through the side traces 20 and the eighth vias Q provided in the base 11, the side traces 20 may be formed by inkjet printing or screen printing first, then the eighth vias Q are formed in the base 11, and finally the fan-out leads 13 are formed through a patterning process, thereby realizing the electrical connection between the plurality of fan-out leads 13 and the connection elements B. Alternatively, the eighth vias Q may be formed in the base 11 first, and then the side traces 20 and the plurality of fan-out leads 13 are formed by ink-jet printing or screen printing, which may also realize the electrical connection between the plurality of fan-out leads 13 and the connection elements B.

It will be noted that, before the plurality of fan-out leads 13 are formed on the base 11, a buffer layer 17 (as shown in FIG. 7) may be formed on the base 11. In this case, if the plurality of fan-out leads 13 and the connection elements B are electrically connected through the eight vias Q provided in the base 11, the eight vias are also formed at corresponding positions of the buffer layer 17.

In S04, a treatment is performed on the sacrificial layer 02 to separate the base 11 and the substrate 01.

In some embodiments, a light irradiation treatment and/or a heating treatment may be performed on the sacrificial layer 02. The sacrificial layer 02 may be an adhesive that may be deactivated by light irradiation and/or heating, or a substance that may be easily removed by light irradiation and/or heating, such as a photoresist.

Figure 14:
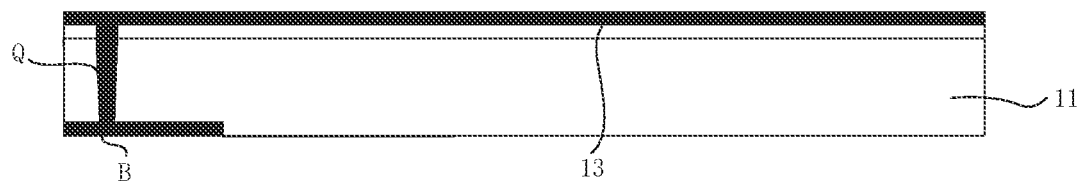
FIG. 14 is a diagram showing a structure of a fan-out lead and a connection element that are formed on opposite sides of a base, in accordance with some embodiments.

In S1 (i.e., S03), as shown in FIGS. 14 and 15, the plurality of fan-out leads 13 are formed on a region, corresponding to the fan-out lead region A1, of the base 11.

For example, the fan-out leads 13 are formed by the patterning process.

In S2, as shown in FIG. 7, an electric field shielding pattern 14 is formed on a side of the plurality of fan-out leads 13 away from the base 11. At least orthographic projections of active layer patterns of transistors of pixel circuits 200 located in the fan-out lead region A1 on the base 11 are located within an orthographic projection of the electric field shielding pattern 14 on the base 11. The electric field shielding pattern 14 is configured to be applied with a constant voltage to shield interference signals, from the plurality of fan-out leads 13, acting on the active layer patterns of the transistors in the fan-out lead region A1.

In S3, as shown in FIG. 7, a pixel circuit layer 12 is formed on a side of the electric field shielding pattern 14 away from the base 11. The pixel circuit layer 12 includes a plurality of pixel circuits 200, at least one pixel circuit 200 is located in the fan-out lead region A1, and a pixel circuit 200 includes a plurality of transistors.

For example, a semiconductor layer SM is formed on the base 11, and the active layer patterns AL of the transistors are formed by photolithography and etching processes.

A gate insulating layer GI is formed on the semiconductor layer SM. The gate insulating layer GI may be of one or more layers. A material of one layer of the gate insulating layer GI may be any of silicon oxide, silicon nitride, and silicon oxynitride, or may be an organic insulating material.

A first gate metal layer GM1 is deposited on the gate insulating layer GI, and gate lines 121, gates G of the transistors and first gate metal patterns Gate1 are formed by photolithography and etching processes.

A first interlayer insulating layer ILD1 is formed on the first gate metal layer GM1. The first interlayer insulating layer ILD1 may be of one or more layers. A material of one layer of the first interlayer insulating layer ILD1 may be any of silicon oxide, silicon nitride, and silicon oxynitride, or may be an organic insulating material.

A second gate metal layer GM2 is deposited on the first interlayer insulating layer ILD1, and second gate metal patterns Gate2 are formed by photolithography and etching processes. The second gate metal pattern Gate2 and a first gate metal pattern Gate1 mentioned above form a capacitor.

A second interlayer insulating layer ILD2 is formed on the second gate metal layer GM2. The second interlayer insulating layer ILD2 may be of one or more layers. A material of one layer of the second interlayer insulating layer ILD2 may be any of silicon oxide (SiO), silicon nitride (SiN), and silicon oxynitride (SiON), or may be an organic insulating material.

A source-drain metal layer is formed on the second interlayer insulating layer ILD2 and is patterned to form sources S, drains D and data lines 122.

For example, the electric field shielding pattern 14 may be formed by a patterning process.

There are mainly two ways to apply the constant voltage to the electric field shielding pattern 14. One way is to electrically connect the electric field shielding pattern 14 to the gate G, the source S, or the drain D of the driving transistor M4, a first power supply line 123, or a second power supply line 124 in the pixel circuit layer 12 along a direction away from the base 11. Another way is to electrically connect the electric field shielding pattern 14 to a first power supply fan-out lead 131 or a second power supply fan-out lead 132 in the fan-out leads 13 along a direction towards to the base 11. The first power supply fan-out lead 131 is configured to be electrically connected to the first power supply line 123, and the second power supply fan-out lead 132 is configured to be electrically connected to the second power supply line 124.

In the first implementation, as shown in FIGS. 7 to 9 and FIG. 11, the electric field shielding pattern 14 is electrically connected to the gate G, the source S, or the drain D of the driving transistor M4, the first power supply line 123, or the second power supply line 124 in the pixel circuit layer 12. In this case, there are two possible scenarios.

In the first scenario, the electric field shielding pattern 14 is used as a bridging electrode to realize the electrical connection between the first power supply line 123 and the first power supply fan-out lead 131 in the pixel circuit 200, or the electrical connection between the second power supply line 124 and the second power supply fan-out lead 132.

In this case, after forming the fan-out leads 13 and before forming the electric field shielding pattern 14, the method further includes: as shown in FIG. 10, forming a fifth via Q5, in the first insulating layer 15 by a patterning process, for electrically connecting the electric field shielding pattern 14 to the first power supply fan-out lead 131 or electrically connecting the electric field shielding pattern 14 to the second power supply fan-out lead 132, so as to use the fifth via Q5 to realize the electrical connection between the electric field shielding pattern 14 and the first power supply fan-out lead 131 or between the electric field shielding pattern 14 and the second power supply fan-out lead 132.

After forming the electric field shielding pattern 14 and before forming the first power supply lines 123, the method further includes: as shown in FIG. 9, forming a third via Q3, for electrically connecting the electric field shielding pattern 14 to the first power supply line 123 in the pixel circuit layer 12, in insulating layers between the film layer where the first power supply line 123 is located and the electric field shielding pattern 14 by a patterning process.

The insulating layers mentioned above include all the insulating layers between the first power supply line 123 and the electric field shielding pattern 14 in the pixel circuit layer 12. Those skilled in the art will understand that, in a case where the electric field shielding pattern 14 is electrically connected to the source S of the driving transistor M4 in the pixel circuit layer 12, the insulating layers include all the insulating layers between the film layer where the source S of the driving transistor M4 in the pixel circuit layer 12 is located and the electric field shielding pattern 14.

By a manner of bridging, there is no need to form a via, used for electrically connecting the first power supply line 123 in the pixel circuit layer 12 to the first power supply fan-out lead 131, in the first insulating layer 15, or form a via, used for electrically connecting the second power supply line 124 in the pixel circuit layer 12 to the second power supply fan-out lead 132, in the first insulating layer 15.

In the second scenario, the electric field shielding pattern 14 is not used as a bridging electrode.

In this case, as shown in FIGS. 7 and 11, the first power supply line 123 is electrically connected to the first power supply fan-out lead 131 through a sixth via Q6, and the second power supply line 124 is electrically connected to the second power supply fan-out lead 132 through a seventh via Q7. On this basis, in order to apply the constant voltage to the electric field shielding pattern 14, as shown in FIG. 10, the fifth via Q5 may only be provided in the first insulating layer 15, so as to realize the electrical connection between the electric field shielding pattern 14 and the first power supply fan-out lead 131 or between the electric field shielding pattern 14 and the second power supply fan-out lead 132. Alternatively, as shown in FIG. 9, a third via Q3 may only be provided in the insulating layers between the film layer where the first power supply line 123 is located and the electric field shielding pattern 14, so as to realize the electrical connection between the electric field shielding pattern 14 and the first power supply line 123. Alternatively, as shown in FIG. 11, a fourth via Q4 may only be provided in the insulating layers between the film layer where the second power supply line 124 is located and the electric field shielding pattern 14, so as to realize the electrical connection between the electric field shielding pattern 14 and the second power supply line 124.

In the second implementation, as shown in FIG. 10, the electric field shielding pattern 14 is electrically connected to the first power supply fan-out lead 131 or the second power supply fan-out lead 132 through the via Q5 located in the insulating layer between the electric field shielding pattern 14 and the plurality of fan-out leads 13.

In this implementation, depending on whether the electric field shielding pattern 14 is used as a bridging electrode, there are two possible scenarios to achieve the electrical connection between the first power supply line 123 in the pixel circuit layer 12 and the first power supply fan-out lead 131, or between the second power supply line 124 in the pixel circuit layer 12 and the second power supply fan-out lead 132.

In the first scenario, the electric field shielding pattern 14 is used as the bridging electrode. The first scenario is the same as the first scenario in the first implementation, and details will not be repeated here.

In the second scenario, the electric field shielding pattern 14 is not used as the bridging electrode. The second scenario is basically the same as the second scenario in the first implementation, and details will not be repeated here.

Beneficial technical effects of the method for manufacturing the display panel provided by the embodiments of the present disclosure are the same as beneficial technical effects of the display panel provided by the embodiments of the present disclosure, and details will not be repeated here.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of present disclosure. Therefore, the protection scope of the present disclosure shall be subject to the protection scope of the claims.

What is claimed is:

1. A display panel having a display region and a fan-out lead region, the fan-out lead region being located in the display region;
the display panel comprising:
a base;
a pixel circuit layer disposed on the base and located in the display region, the pixel circuit layer including a plurality of pixel circuits, at least one pixel circuit being located in the fan-out lead region, a pixel circuit including a plurality of transistors, and each transistor having an active layer pattern;
a plurality of fan-out leads disposed between the base and the pixel circuit layer and located in the fan-out lead region, at least one fan-out lead being electrically connected to the pixel circuits; and
an electric field shielding pattern disposed between the pixel circuit layer and a film layer where the plurality of fan-out leads are located, at least orthographic projections of active layer patterns of transistors of the pixel circuit located in the fan-out lead region on the base being located within an orthographic projection of the electric field shielding pattern on the base, the electric field shielding pattern being configured to be applied with a constant voltage to shield interference signals, from the plurality of fan-out leads, acting on the active layer patterns of the transistors located in the fan-out lead region; and
the display panel further comprising:
connection elements disposed on a side of the base away from the plurality of fan-out leads; and
a plurality of side traces extending from the fan-out lead region to the side of the base away from the plurality of fan-out leads through a side surface of the base, each fan-out lead being electrically connected to a connection element through a side trace; or,
the display panel further comprising:
connection elements disposed on a side of the base away from the plurality of fan-out leads, wherein
the base is provided with a plurality of eighth vias therein, and each fan-out lead is electrically connected to a connection element through an eighth via.

2. The display panel according to claim 1, wherein a region of the display region other than the fan-out lead region is a main display region; and orthographic projections of active layer patterns of transistors of pixel circuits located in the main display region on the base are located within the orthographic projection of the electric field shielding pattern on the base.

3. The display panel according to claim 1, further comprising:
gate driving circuits electrically connected to the plurality of pixel circuits, the gate driving circuits being configured to provide gate driving signals to the plurality of pixel circuits, and a gate driving circuit including another plurality of transistors, wherein the gate driving circuits are disposed in the display region; or, the display panel further has a peripheral region disposed around the display region, and the gate driving circuits are disposed in the peripheral region, wherein
orthographic projections of active layer patterns of transistors of the gate driving circuits on the base are located within the orthographic projection of the electric field shielding pattern on the base.

4. The display panel according to claim 1, wherein the pixel circuit layer further includes:
first signal lines extending into the fan-out lead region and electrically connected to a pixel circuit located in the fan-out lead region, wherein
orthographic projections of portions, extending to the fan-out lead region, of the first signal lines on the base are located within the orthographic projection of the electric field shielding pattern on the base.

5. The display panel according to claim 1, wherein the pixel circuit includes a driving transistor;
the electric field shielding pattern is electrically connected to a gate of the driving transistor through a first via in insulating layers between a film layer where the gate of the driving transistor is located and the electric field shielding pattern; or,
the electric field shielding pattern is electrically connected to a source or a drain of the driving transistor through a second via in insulating layers between a film layer where the source and the drain of the driving transistor are located and the electric field shielding pattern.

6. The display panel according to claim 1, further comprising:
at least one ground line disposed between the pixel circuit layer and the film layer where the plurality of fan-out leads are located, wherein the electric field shielding pattern is electrically connected to the ground line.

7. The display panel according to claim 1, wherein the electric field shielding pattern has a continuous structure.

8. The display panel according to claim 1, wherein the electric field shielding pattern includes a plurality of electric field shielding electrodes arranged separately, and each pixel circuit located in the fan-out lead region corresponds to an electric field shielding electrode;
the electric field shielding electrode is electrically connected to a gate, a source or a drain of a driving transistor in the plurality of transistors of a corresponding pixel circuit, or
the pixel circuit layer further includes first power supply lines, and the electric field shielding electrode is electrically connected to a first power supply line that is electrically connected to a corresponding pixel circuit, or
the display panel further comprises a plurality of elements to be driven, the pixel circuit layer further includes second power supply lines, and the electric field shielding electrode is electrically connected to a second power supply line that is electrically connected to an element to be driven by a corresponding pixel circuit.

9. The display panel according to claim 1, wherein the electric field shielding pattern includes a plurality of electric field shielding electrodes arranged separately, and each transistor located in the fan-out lead region corresponds to an electric field shielding electrode;
the electric field shielding electrode is electrically connected to a gate, a source or a drain of a corresponding transistor.

10. The display panel according to claim 1, wherein the orthographic projection of the electric field shielding pattern on the base and at least part of a region, except for orthographic projections of active layer patterns of the plurality of pixel circuits on the base, of the display panel are staggered from each other.

11. The display panel according to claim 1, wherein the pixel circuit layer includes a semiconductor layer, and the semiconductor layer includes active layer patterns of the plurality of pixel circuits; and
a shape of the electric field shielding pattern is substantially same as a shape of the semiconductor layer.

12. The display panel according to claim 1, wherein the electric field shielding pattern is configured to be applied with the constant voltage of 0V.

13. The display panel according to claim 1, further comprising:
a driving circuit disposed on the side of the base away from the plurality of fan-out leads, the driving circuit being electrically connected to the connection elements.

14. A tiled screen comprising a plurality of display panels, the plurality of display panels being tiled together, and at least one display panel being the display panel according to claim 1.

15. The display panel according to claim 1, further comprising:
a plurality of elements to be driven disposed on a side of the pixel circuit layer away from the base, wherein a first electrode of each element to be driven is electrically connected to a pixel circuit;
wherein the pixel circuit layer further includes:
a first power supply line electrically connected to pixel circuits and configured to transmit a first power supply voltage signal to the pixel circuits connected thereto; and
a second power supply line electrically connected to second electrodes of elements to be driven and configured to transmit a second power supply voltage signal to the second electrodes of the elements to be driven connected thereto;
the plurality of fan-out leads include:
a first power supply fan-out lead configured to be electrically connected to the first power supply line; and
a second power supply fan-out lead configured to be electrically connected to the second power supply line; and
the electric field shielding pattern is electrically connected to the first power supply line through a third via in insulating layers between a film layer where the first power supply line is located and the electric field shielding pattern; or,
the electric field shielding pattern is electrically connected to the second power supply line through a fourth via in insulating layers between a film layer where the second power supply line is located and the electric field shielding pattern; or,
the electric field shielding pattern is electrically connected to the first power supply fan-out lead or the second power supply fan-out lead through a fifth via in an insulating layer between the film layer where the plurality of fan-out leads are located and the electric field shielding pattern.

16. The display panel according to claim 15, wherein
the first power supply fan-out lead is electrically connected to the first power supply line through a sixth via in insulating layers between the film layer where the first power supply line is located and the film layer where the plurality of fan-out leads are located; the second power supply fan-out lead is electrically connected to the second power supply line through a seventh via in insulating layers between the film layer where the second power supply line is located and the film layer where the plurality of fan-out leads are located; or,
the electric field shielding pattern is electrically connected to the first power supply line, and the first power supply fan-out lead is electrically connected to the electric field shielding pattern through the fifth via in the insulating layer between the electric field shielding pattern and the film layer where the plurality of fan-out leads are located; or, the electric field shielding pattern is electrically connected to the second power supply line, and the second power supply fan-out lead is electrically connected to the electric field shielding pattern through the fifth via in the insulating layer between the electric field shielding pattern and the film layer where the plurality of fan-out leads are located.

17. A method for manufacturing a display panel, the display panel having a display region and a fan-out lead region, and the fan-out lead region being located in the display region, the method comprising:
forming a plurality of fan-out leads on a region, corresponding to the fan-out lead region, of a base;
forming an electric field shielding pattern on a side of the plurality of fan-out leads away from the base; and
forming a pixel circuit layer on a side of the electric field shielding pattern away from the base, wherein
the pixel circuit layer includes a plurality of pixel circuits, at least one pixel circuit is located in the fan-out lead region, a pixel circuit includes a plurality of transistors, and each transistor has an active layer pattern;
at least orthographic projections of active layer patterns of transistors of the pixel circuit located in the fan-out lead region on the base are located within an orthographic projection of the electric field shielding pattern on the base; the electric field shielding pattern is configured to be applied with a constant voltage to shield interference signals, from the plurality of fan-out leads, acting on the active layer patterns of the transistors located in the fan-out lead region; and
the method further comprising:
before forming the plurality of fan-out leads on the base, forming a sacrificial layer on a substrate, and forming connection elements on the sacrificial layer;
forming the base of the display panel on a side of the connection elements away from the substrate; and
after forming the plurality of fan-out leads on the base, performing a treatment on the sacrificial layer to separate the base and the substrate.

18. The method according to claim 17, wherein forming the plurality of fan-out leads on the region, corresponding to the fan-out lead region, of the base, includes:
forming the plurality of fan-out leads on the base and make the plurality of fan-out leads electrically connected to the connection elements.

19. A display panel having a display region and a fan-out lead region, the fan-out lead region being located in the display region;

the display panel comprising:
a base;
a pixel circuit layer disposed on the base and located in the display region, the pixel circuit layer including a plurality of pixel circuits, at least one pixel circuit being located in the fan-out lead region, a pixel circuit including a plurality of transistors, and each transistor having an active layer pattern;
a plurality of fan-out leads disposed between the base and the pixel circuit layer and located in the fan-out lead region, at least one fan-out lead being electrically connected to the pixel circuits;
an electric field shielding pattern disposed between the pixel circuit layer and a film layer where the plurality of fan-out leads are located, at least orthographic projections of active layer patterns of transistors of the pixel circuit located in the fan-out lead region on the base being located within an orthographic projection of the electric field shielding pattern on the base, the electric field shielding pattern being configured to be applied with a constant voltage to shield interference signals, from the plurality of fan-out leads, acting on the active layer patterns of the transistors located in the fan-out lead region; and
a plurality of elements to be driven disposed on a side of the pixel circuit layer away from the base, wherein a first electrode of each element to be driven is electrically connected to a pixel circuit;
wherein the pixel circuit layer further includes:
a first power supply line electrically connected to pixel circuits and configured to transmit a first power supply voltage signal to the pixel circuits connected thereto; and
a second power supply line electrically connected to second electrodes of elements to be driven and configured to transmit a second power supply voltage signal to the second electrodes of the elements to be driven connected thereto;

the plurality of fan-out leads include:
a first power supply fan-out lead configured to be electrically connected to the first power supply line; and
a second power supply fan-out lead configured to be electrically connected to the second power supply line; and the electric field shielding pattern is electrically connected to the first power supply line through a third via in insulating layers between a film layer where the first power supply line is located and the electric field shielding pattern; or, the electric field shielding pattern is electrically connected to the second power supply line through a fourth via in insulating layers between a film layer where the second power supply line is located and the electric field shielding pattern; or, the electric field shielding pattern is electrically connected to the first power supply fan-out lead or the second power supply fan-out lead through a fifth via in an insulating layer between the film layer where the plurality of fan-out leads are located and the electric field shielding pattern.

* * * * *